United States Patent
Ogura et al.

(10) Patent No.: US 7,436,712 B2
(45) Date of Patent: Oct. 14, 2008

(54) NONVOLATILE MEMORY DEVICE INCLUDING CIRCUIT FORMED OF THIN FILM TRANSISTORS

(75) Inventors: Taku Ogura, Hyogo (JP); Tadaaki Yamauchi, Hyogo (JP); Takashi Kubo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/979,767

(22) Filed: Nov. 8, 2007

(65) Prior Publication Data

US 2008/0074925 A1   Mar. 27, 2008

Related U.S. Application Data

(60) Continuation of application No. 11/482,019, filed on Jul. 7, 2006, now Pat. No. 7,307,886, which is a division of application No. 10/941,102, filed on Sep. 15, 2004, now Pat. No. 7,149,115.

(30) Foreign Application Priority Data

Sep. 16, 2003   (JP)   ............................. 2003-323358

(51) Int. Cl.
G11C 11/34   (2006.01)
G11C 5/14   (2006.01)
G11C 8/00   (2006.01)
(52) U.S. Cl. ............................ 365/185.23; 365/185.22; 365/226; 365/227; 365/230.06

(58) Field of Classification Search ............ 365/185.22, 365/185.23, 185.29, 185.3, 226, 227, 230.06
See application file for complete search history.

(56) References Cited

U.S. PATENT DOCUMENTS

| 5,260,903 | A | 11/1993 | Suyama et al. |
| 5,343,437 | A | 8/1994 | Johnson et al. |
| 5,724,292 | A | 3/1998 | Wada ......................... 365/207 |
| 5,768,194 | A | 6/1998 | Matsubara et al. |
| 6,069,824 | A | 5/2000 | Kojima et al. |
| 6,185,151 | B1 | 2/2001 | Cho |
| 6,355,531 | B1 | 3/2002 | Mandelman et al. |
| 6,392,955 | B2 | 5/2002 | Pawlowski ............. 365/230.06 |
| 6,462,999 | B1 | 10/2002 | Amano |
| 6,614,691 | B2 | 9/2003 | Roohparvar |
| 6,631,092 | B2 | 10/2003 | Yamasaki |
| 6,831,860 | B2 | 12/2004 | Lee et al. |
| 6,873,561 | B2 | 3/2005 | Ooishi |
| 6,879,513 | B2 | 4/2005 | Ooishi ................... 365/230.06 |
| 6,927,999 | B2 | 8/2005 | Sim et al. |
| 7,110,282 | B2 | 9/2006 | Kono et al. ............ 365/230.06 |

FOREIGN PATENT DOCUMENTS

| JP | 8-329690 | 12/1996 |
| JP | 2003-501801 A | 1/2003 |
| WO | WO 00/74126 A1 | 12/2000 |

*Primary Examiner*—Trong Phan
(74) *Attorney, Agent, or Firm*—McDermott Will & Emery LLP

(57) ABSTRACT

A transistor is arranged for electrically isolating a sense amplifier formed of a thin film transistor from a data line electrically coupled to the sense amplifier. When a write driver drives the data line, a control signal is applied to isolate the data line from the sense amplifier.

4 Claims, 20 Drawing Sheets

FIG.3

| | SAE | SEL | ISEL | VRSA | RSTBD | DVE | BDE | CAU CAL | SGL | WL | SL | PW |
|---|---|---|---|---|---|---|---|---|---|---|---|---|
| READ | 1.8V | 5V | 0V | 1.8V-α | 0V | 0V | 0.7V | 5V-Vth | 5V | 5V | 0V | 0V |
| WRITE | 0V | 0V | 0V | 1.8V | 1.8V | 1.8V | 5V/0V | 10V | 10V | 10V | 0V | 0V |
| ERASE | 0V | 5V | 0V | 1.8V | 1.8V | 0V | 0V | 0V | 0V | -10V | 10V | 10V |

FIG.8

| | VPWL1 | VPWL2 | VNWL1 | VNWL2 | Nd1 | GWL<0> | GWL<1> | LWL |
|---|---|---|---|---|---|---|---|---|
| STANDBY | 5V | 5V–Vth | 0V | 0V | 5V | 0V | 0V | 0V |
| READ | 5V | 5V | 0V | 0V | 0V | 5V | 0V | 5V |
| WRITE | 10V | 10V | 0V | 0V | 0V | 10V | 0V | 10V |
| ERASE | 0V | 0V | –10V | –10V | –10V | 0V | 0V | –10V |
| OVER-ERASE VERIFY 1 | 5V | 1.5V | –2V | –2V | –2V | 1.5V | –2V | 1.5V |
| OVER-ERASE VERIFY 2 | 5V | 1.5V | –2V | 0V | –2V | 1.5V | 0V | 1.5V |

FIG.14

|  | VPS | VBOOST | ICONVPS | CONVB | VPY | CAU CAL | BDE | SGL | WL | PW | SL |
|---|---|---|---|---|---|---|---|---|---|---|---|
| READ | 5V | 5V | 5V | 0V | 5V-Vth | 5V-Vth | 0.7V | 5V | 5V | 0V | 0V |
| WRITE | 10V | 5V | 0V | 0V | 10V | 10V | 5V/0V | 10V | 10V | 0V | 0V |
| ERASE | 5V | 5V | 5V | 0V | 5V-Vth | 0V | 0V | 0V | -10V | 10V | 10V |

NONVOLATILE MEMORY DEVICE INCLUDING CIRCUIT FORMED OF THIN FILM TRANSISTORS

RELATED APPLICATION

This application is a continuation of U.S. application Ser. No. 11/482,019, filed Jul. 7, 2006, now U.S. Pat. No. 7,307,886, which is a divisional application of Ser. No. 10/941,102, filed Sep. 15, 2004, now U.S. Pat. No. 7,149,115, which claims priority of Japanese Patent application No. 2003-323358(P), filed Sep. 16, 2003, and the contents of which are herewith incorporated by reference.

BACKGROUND OF THE INVENTION

1. Field of the Invention

The present invention relates to a nonvolatile memory device, and particularly to a nonvolatile memory device operable with a low voltage.

2. Description of the Background Art

In accordance with progress of miniature processing technologies in recent years, cell sizes as well as sizes of transistors (film thicknesses of oxide films and others) have been reduced for reducing sizes of chips. However, a memory device uses different operation voltages for executing various operations. Therefore, it is difficult to employ such a structure that all circuit regions are formed of transistors, which have oxide films of small film thickness and thus small sizes, and may be referred to as "thin film transistors" hereinafter. In particular, a flash memory and others use various operation voltages in various operation sequences, and therefore generally have structures, in which memories subjected to high voltages or the like use transistors having large film thickness and relatively large sizes. These transistors may be referred to as "thick film transistors" hereinafter. Sense amplifiers and others, which must perform fast operations, use transistors capable of fast operation with a low operation voltage, and thus use transistors having small film thickness and relatively small sizes. This can reduce whole chip sizes. Various manners have been proposed for reducing transistor sizes and thereby reducing chip sizes. Japanese Patent Laying-Open No. 8-329690 has disclosed a nonvolatile memory device, in which a well structure of a memory cell is improved to lower an operation voltage of the memory cell, and thereby film thicknesses of transistors in peripheral circuits can be reduced.

However, a chip including two kinds of transistors as described above, i.e., a chip formed of thin film transistors and thick film transistors must be controlled to prevent application of a high voltage to the thin film transistors.

Particularly, in a flash memory, voltages at various levels are supplied to memory cells and peripheral circuits depending on various operation sequences, and therefore it is necessary to prevent breakage of the thin film transistors having small film thicknesses when an operation voltage is high.

SUMMARY OF THE INVENTION

An object of the invention is overcome the above problems, and particularly to provide a nonvolatile memory device, which can prevent breakage of a circuit formed of thin film transistors.

Reduction of transistor sizes in recent years has relatively lowered the operation voltage, and thereby has reduced a difference in voltage level between a threshold voltage of the transistor forming a driver circuit and an operation voltage thereof. Therefore, it is now difficult to supply an intended operation voltage from the driver circuit due to an influence of a threshold voltage of the transistor in some cases.

Another object of the invention is to overcome the above problems, and particularly to provide a nonvolatile memory device having a driver circuit, which can reliably supply an intended operation voltage even if the intended operation voltage is low.

Still another object of the invention is to provide a nonvolatile memory device, in which drive capabilities of various driver circuits are improved to allow fast and stable operations.

Yet another object of the invention is to provide a nonvolatile memory device, in which noises between signal lines are reduced to allow more reliable operations.

A nonvolatile memory device according to the invention includes a memory array, a sense amplifier, a write driver, a data line and an isolation circuit. The memory array has a plurality of memory cells arranged in rows and columns and each executing data storage. The sense amplifier amplifies read data read from the memory cell in the memory array in a data read operation. The write driver provides write data to be written into the memory cell in the memory array in a data write operation. The data line is electrically coupled to the sense amplifier and the write driver, and is electrically coupled to the memory array for transmitting the read data and the write data in the data read operation and the data write operation, respectively. The isolation circuit electrically isolates the sense amplifier from the data line in the data write operation.

According to the invention, the isolation circuit is provided for electrically isolating the data line electrically coupled to the sense amplifier from the data line in the data write operation. Thereby, such a situation can be prevented that a high voltage applied to the data line is applied as a load to the sense amplifier in the data write operation. Therefore, a malfunction can be prevented, and reliability of the sense amplifier can be ensured.

According to the invention, a nonvolatile memory device includes a memory array, a plurality of source lines, and a plurality of driver transistors. The memory array has a plurality of memory cells arranged in rows and columns. Each of the plurality of source lines is provided corresponding to a predetermined number of the memory cell rows in the memory array. The plurality of driver transistors are provided corresponding to ends on one side of the plurality of source lines, and each being responsive to a control signal to couple electrically a fixed voltage to the corresponding source line. In the row direction, the memory array is divided into first and second memory blocks. The plurality of source lines included in a first group and electrically coupled to the memory cells in the first memory block are different in number from the source lines included in a second group and electrically coupled to the memory cells in the second memory block.

According to the invention, the memory array is divided into the first and second memory blocks, and the source lines in the first memory block are different in number from the source lines in the second memory block. By changing the number of the source lines in accordance with the load applied to the source lines from the memory block, it is possible to reduce the load on the source lines so that variations in voltage level of the source lines can be suppressed, and the drive capability of the driver transistor can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates voltage levels applied in various sequences to the read/write circuitry according to the first embodiment of the invention.

FIG. 8 illustrates voltage levels applied in various operation sequences to the row select circuitry according to the second embodiment of the invention.

FIG. 14 illustrates voltage levels applied in various sequences to the column select circuitry according to the third embodiment of the invention.

DESCRIPTION OF THE PREFERRED EMBODIMENTS

Embodiments of the invention will now be described with reference to the drawings. In the figures, the same or corresponding portions bear the same reference numbers.

Figure 1:
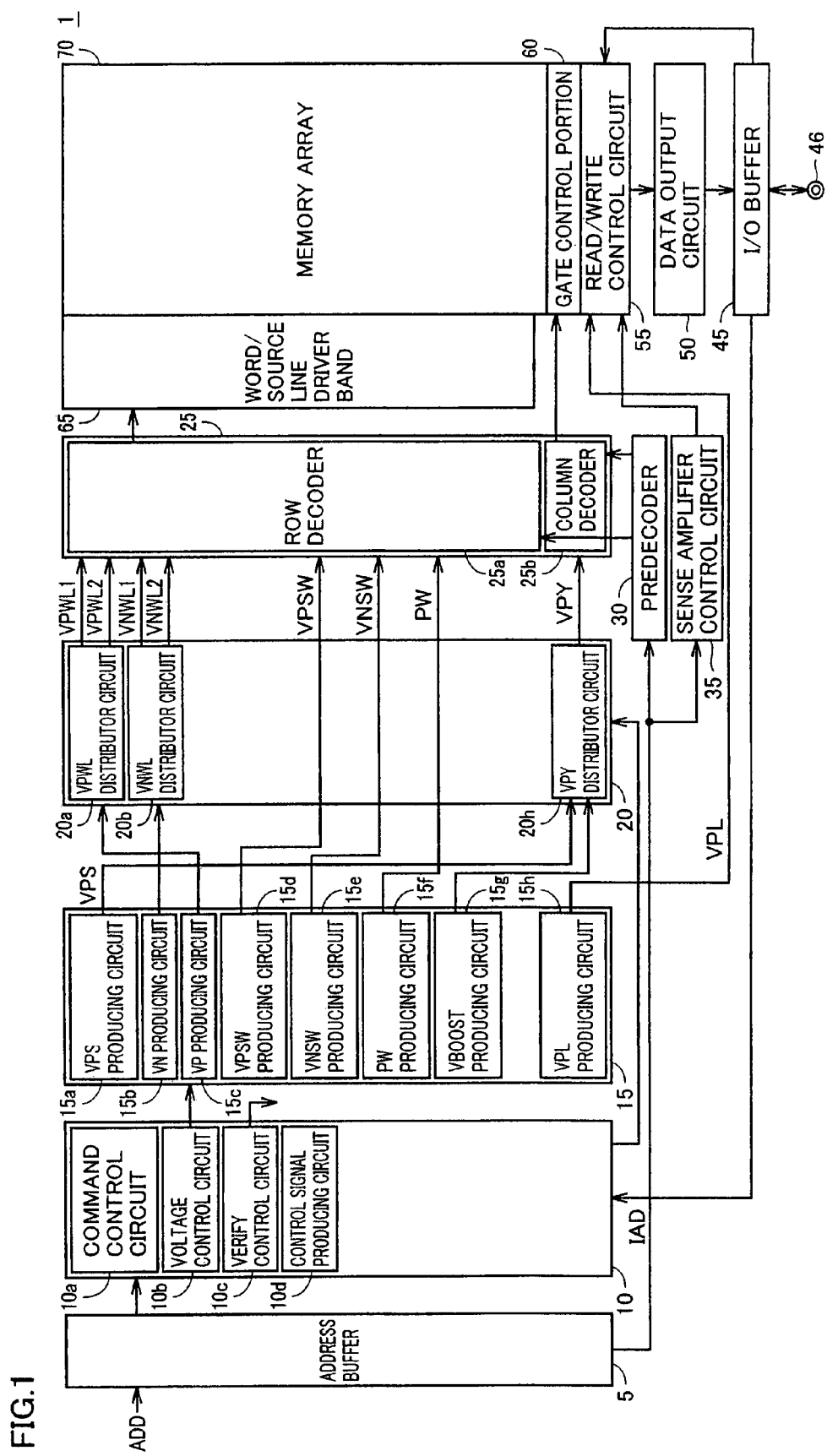
FIG. 1 is a schematic block diagram showing a memory device according to an embodiment of the invention.

Referring to FIG. 1, a memory device 1 according to an embodiment of the invention includes an address buffer 5, which receives an external address ADD and issues an internal address IAD, a control circuit 10, which receives internal address IAD and controls various operations in memory device 1, a voltage producing circuit 15 producing voltages to be used in memory device 1, and a voltage distributor circuit 20, which receives the voltages produced by voltage producing circuit 15, and distributes the voltages after adjusting levels thereof. According to the embodiment of the invention, memory device 1 is supplied with one power supply voltage VCC of 1.8 V (which may also be referred to as a "device voltage" hereinafter), as a power supply voltage. By using power supply voltage VCC thus supplied, voltage producing circuit 15 produces a word line boosted voltage or lowered voltage to be used in various operation sequences.

Memory device 1 includes a predecoder 30, which receives internal address IAD sent from address buffer 5, and produces a predecode signal, a select circuit 25, which receives a predecode signal sent from predecoder 30, and selects rows and columns in a memory array 70, memory array 70 including memory cells arranged in rows and columns, a word/source line driver band 65 driving a plurality of word lines, which are provided corresponding to the memory cell rows, respectively, and a source line, a gate control portion 60 selecting the column in the memory array according to the select operation of select circuit 25, a read/write control circuit 55, which amplifies and provides read data and write data in the data read operation and the data write operation, respectively, a data output circuit 50 providing the data in the data read operation, an I/O buffer 45, which buffers the read data received from data output circuit 50 for providing it to an external terminal 46, and transmits the write data sent from external terminal 46 to a write driver of read/write control circuit 55, and a sense amplifier control circuit 35 controlling sense amplifiers in read/write control circuit 55. Specific structures of memory array 70 and gate control portion 60 will be described later.

Select circuit 25 includes a row decoder 25a, which selects the word line provided corresponding to the memory cell row according to the predecode signal sent from predecoder 30, and a column decoder 25b, which selects the bit line provided corresponding to the memory cell column according to the predecode signal sent from predecoder 30.

Control circuit 10 includes a command control circuit 10a, which produces a command instructing various operation sequences in memory device 1 according to internal address IAD sent from address buffer 5, a voltage control circuit 10b controlling operation voltages of various circuits in voltage producing circuit 15, a verify control circuit 10c controlling verify operations in a data read operation and a data write operation, which are different from the read, write and erase operations in a normal operation mode, and a control signal producing circuit 10d producing control signals for various circuits.

Voltage producing circuit 15 includes a VPS producing circuit 15a producing a voltage VPS, VN and VP producing circuits 15b and 15c, which produce voltages VN and VP to be used for driving the word lines, respectively, VPSW and VNSW producing circuits 15d and 15e producing operation voltages VPSW and VNSW of the source line driver, respectively, a PW producing circuit 15f producing a well voltage PW for memory cells and others of the memory array, a VBOOST producing circuit 15g, which produces a word line boosted voltage VBOOST to be used for activating word lines WL and others, and a VPL producing circuit 15h, which produces a high voltage VPL supplied to the write driver in the data write operation.

Voltage distributor circuit 20 includes a VPWL distributor circuit 20a, which receives voltage VP, and distributes it as voltages VPWL1 and VPWL2, a VNWL distributor circuit 20b, which receives voltage VN, and distributes it as voltages VNWL1 and VNWL2, and a VPY producing circuit 20h, which receives voltage VPS and word line boosted voltage VBOOST, and provides a voltage VPY.

According to the structure of a first embodiment, a sense amplifier band is formed of thin film transistors. Memory array 70, gate control portion 60 and others, which may be referred to as "read/write circuitry" hereinafter, are formed of thick film transistors. In this structure, the thin film transistors forming the sense amplifier band are prevented from receiving a high voltage as described below.

Figure 2:
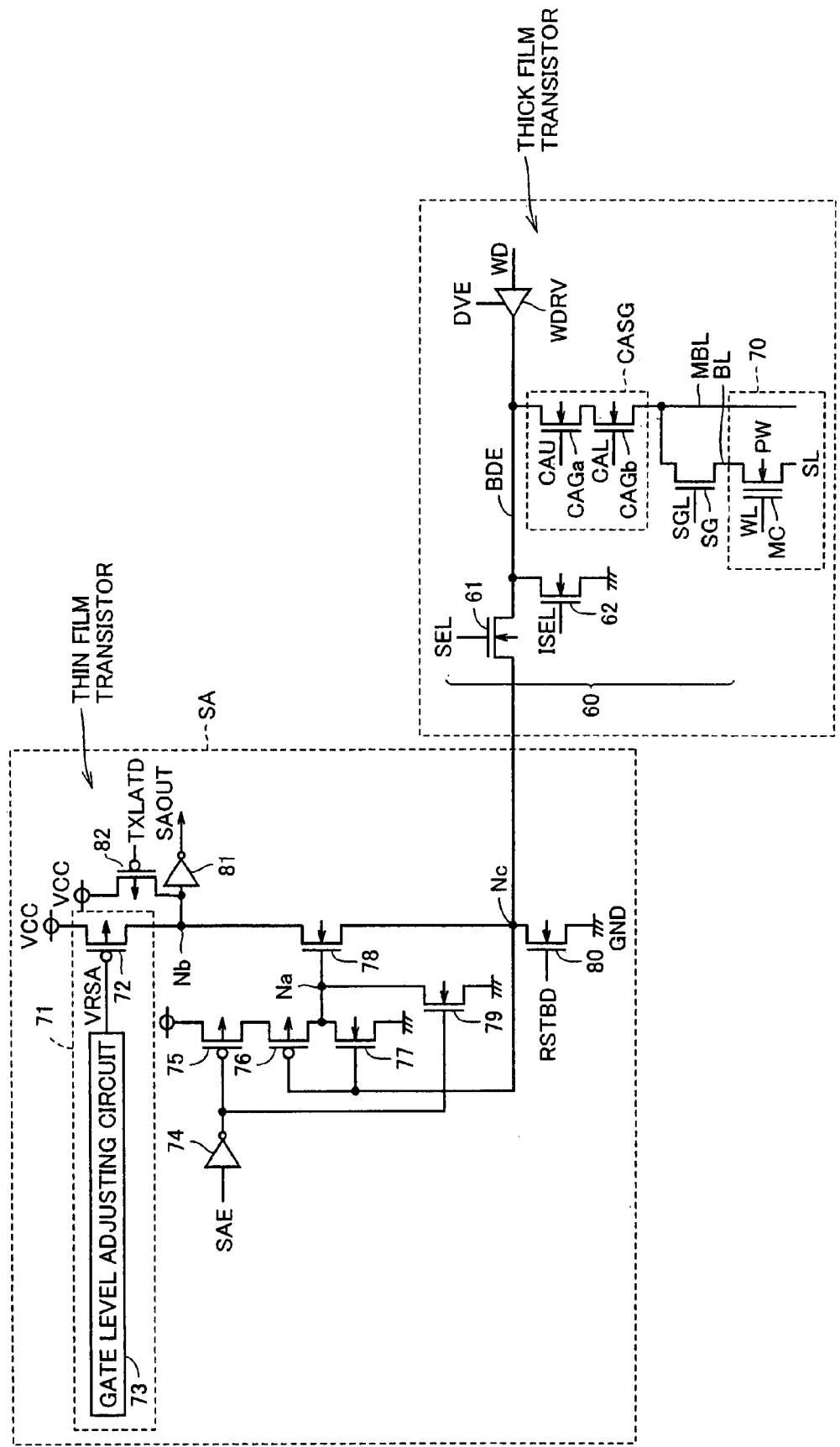
FIG. 2 illustrates a concept of read/write circuitry according to the first embodiment of the invention.

Referring to FIG. 2, the read/write circuitry according to the first embodiment of the invention includes a sense amplifier SA included in read/write control circuit 55, a write driver WDRV, gate control portion 60 and memory array 70 provided with the plurality of memory cells arranged in rows and columns. In this structure, sense amplifier SA is formed of thin film transistors. Write driver WDRV, gate control portion 60 and memory array 70 are formed of thick film transistors. FIG. 2 shows, by way of example, one memory cell MC in memory array 70. Memory cell MC is a so-called memory cell transistor, which has a gate electrically coupled to word line WL. One end side, i.e., a source side of memory cell MC is electrically coupled to a bit line BL, and the other end side, i.e., a drain side is electrically coupled to a source line SL. Other memory cells MC have similar structures.

Sense amplifier SA includes a constant current producing portion 71, inverters 74 and 81, transistors 75-80, and a transistor 82 for precharging. In this example, transistors 75, 76 and 82 are P-channel MOS transistors, and transistors 77-80 are N-channel MOS transistors.

Constant current producing portion 71 includes a gate level adjusting circuit 73, and a transistor 72 (P-channel MOS transistor).

Transistor 72 is arranged between power supply voltage VCC and an output node Nb, and has a gate receiving a control voltage VRSA from gate level adjusting circuit 73.

Gate level adjusting circuit 73 adjusts the voltage level of control voltage VRSA to place a constant voltage across the gate and source of transistor 72 so that a constant amount of current may flow through transistor 72. In this embodiment, power supply voltage VCC is set to 1.8 V.

Transistors 75-77 are connected in series between power supply voltage VCC and a ground voltage GND. Transistor 75 receives on its gate an inverted signal of a control signal SAE sent from inverter 74. Gates of both transistors 76 and 77 are electrically connected to a node Nc. Transistor 78 is arranged between nodes Nb and Nc, and has a gate electrically coupled to a connection node Na between transistors 76 and 77. Transistor 79 is arranged between node Na and ground voltage GND, and has a gate receiving an inverted signal of control signal SAE sent from inverter 74. Transistor 80 is arranged between node Nc and ground voltage GND, and has a gate receiving-control signal RSTBD.

In the data read operation, sense amplifier SA senses data stored in memory cell MC according to an amount of current flowing through selected memory cell MC via a data line BDE electrically coupled to node Nc, and amplifies the sensed data to output it as read data SAOUT.

More specifically, the voltage level of node Nb is set according to the voltage level of node Nc, which is set according to a current passing through the selected memory cell, and read data SAOUT is output. For example, when the passing current is large, and node Nc is at a relatively low voltage level, transistor 76 is turned on to raise the voltage level of node Na, and transistor 78 further lowers the voltage level of node Nb. Thus, the voltage level of node Nb is amplified to the "L" level.

When the passing current is small, and node Nc is at a relatively high voltage level, transistor 77 is turned on to lower the voltage level of node Na, and transistor 78 raises the voltage level of node Nb. Thus, the voltage level of node Nb is amplified to the "H" level. In accordance with this amplifying operation, inverter 81 inverts the voltage level signal applied to node Nb, and outputs it as read data SAOUT.

Gate control portion 60 will now be described briefly, although this will be described later in detail.

Gate control portion 60 includes transistors 61 and 62, a gate select circuit CASG, a gate transistor SG and data line BDE. Transistors 61, 62 and SG are N-channel MOS transistors.

Transistor 61 is arranged between node Nc of sense amplifier SA and data line BDE, and has a gate receiving a control signal SEL. Transistor 62 is arranged between data line BDE and ground voltage GND, and has a gate receiving a control signal ISEL. Control signals SEL and ISEL are issued from control signal producing circuit 10*d*. Transistor 61 functions as an isolation circuit for electrically isolating sense amplifier SA from data line BDE. Transistor 62 functions as a reset circuit for electrically coupling data line BDE to ground voltage GND before the read operation.

Gate select circuit CASG receives control signals CAU and CAL sent from column decoder 25*b* in the select circuit selecting the column, and electrically couples a main bit line MBL to data line BDE. Gate transistor SG electrically couples bit line BL to selected memory cell MC in response to a control signal SGL.

Gate select circuit CASG includes transistors CAGa and CAGb. In this example, transistors CAGa and CAGb are N-channel MOS transistors.

Transistors CAGa and CAGb are arranged between data line BDE and main bit line MBL, and receive control signals CAU and CAL, respectively. For example, when both control signals CAU and CAL are at the "H" level, data line BDE is electrically coupled to main bit line MBL.

FIG. 3 illustrates levels of voltages applied to the read/write circuitry according to the first embodiment of the invention in various sequences.

First, an operation for reading will be described.

Gate control portion 60 sets control signal SEL to 5 V ("H" level) so that node Nc of sense amplifier SA is electrically coupled to data line BDE. Gate select circuit CASG electrically couples selected main bit line MBL to data line BDE in response to predetermined control signals CAU and CAL (5 V−Vth="H" level) applied thereto. In response to control signal SGL (5 V="H" level), bit line BL, which is electrically coupled to selected memory cell MC, is electrically coupled to main bit line MBL. Then, sense amplifier SA becomes active. More specifically, control signal SAE is set to 1.8 V ("H" level) so that a current path is formed from sense amplifier SA to selected memory cell MC. In this example, a control signal TXLATD ("L" level) is applied to turn on transistor 82 so that data line BDE is precharged to a voltage level of 0.7 V. In this state, word line WL electrically coupled to selected memory cell MC is activated so that a passing current flows through the memory cell, and a data read operation based on the passing current is executed. Control signal VRSA is set to (1.8 V−α), where α is a voltage predetermined for supplying an intended constant current.

An operation of the sense amplifier in the read operation will now be described with reference to a timing chart of FIG. 4.

Figure 4:
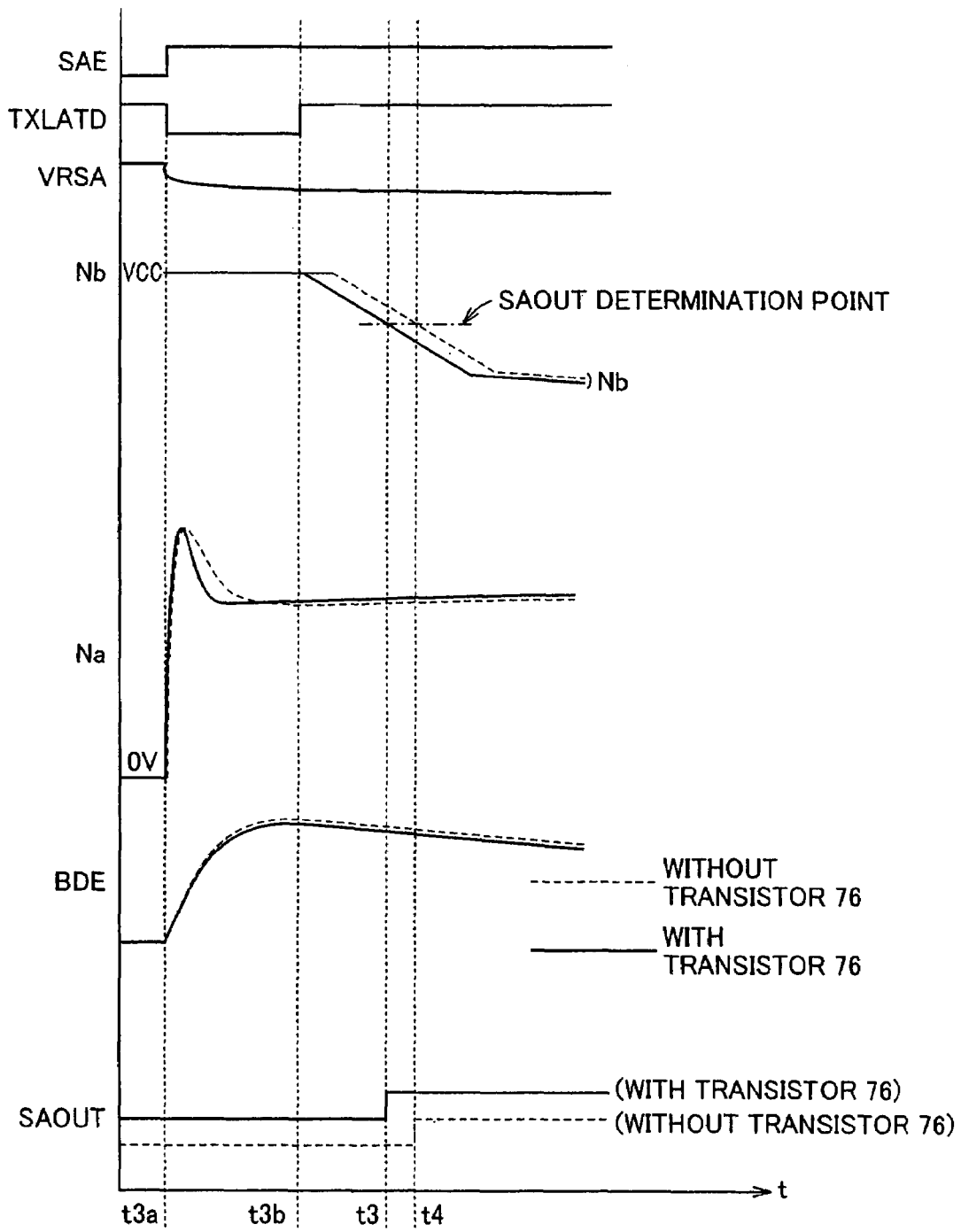
FIG. 4 is a timing chart illustrating operations of a sense amplifier in a read operation.

At a time T3*a* in FIG. 4, control signal SAE rises to the "H" level so that reading is executed. In accordance with similar timing, transistor 82 is supplied with control signal TXLATD ("L" level). Thereby, transistor 82 is turned on to precharge data line BDE to a predetermined voltage of 0.7 V. Sense amplifier SA according to the first embodiment of the invention includes transistors 76 and 77, which feed back the voltage level of node Nc to gate electrodes of transistor 78. A conventional structure has only transistor 77, and uses transistor 75 for minutely adjusting the voltage level of node Na by raising it. However, it has a small gain, and thus cannot minutely adjust the voltage level of node Na to a sufficient extent so that the setting of the voltage level of node Nc requires a relatively long time.

Since the above structure can minutely adjust the voltage level of node Na by using both transistors 77 and 76, it is possible to reduce a period required for setting the voltage level of node Nc, i.e., the voltage level of data line BDE to the intended voltage level of 0.7 V (time t3b). Thus, by providing the adjusting mechanism of adjusting the gate voltage of transistor 78, the time (precharge period) for setting of the voltage level of node Nc can be short, and the data read operation can be performed fast. In this example, read data SAOUT is fixed at a time t3 owing to provision of transistor 76. If transistor 76 is not provided, read data SAOUT is fixed at a time t4 as represented by dotted line.

An operation for writing will now be described.

Referring to FIG. 3, gate select circuit CASG electrically couples selected main bit line MBL to data line BDE in response to control signals CAU and CAL (10 V="H" level). In response to control signal SGL (10 V="H" level), bit line BL, which is electrically coupled to selected memory cell MC, is electrically coupled to main bit line MBL. Thereby, write driver WDRV is electrically coupled to selected memory cell MC. Write driver WDRV becomes active in response to reception of a control signal DVE (1.8 V="H" level), and VPL producing circuit 10d supplies a voltage of 5V/0V to data line BDE according to the data level of received write data WD. In this state, word line WL, which is electrically coupled to selected memory cell MC, is activated so that a voltage corresponding to the write data is supplied to memory cell MC, and the data write operation according to the intended write data is executed with CHE (Channel Hot Electrons). Control signal producing circuit 10d issues control signal DVE.

In this case, data line BDE receives a high voltage of 5 V. Transistor 61 receives control signal SEL (0 V="L" level) on its gate. Thus, transistor 61 is turned off. Thereby, a high voltage is applied to data line BDE in the write operation, but transistor 61 electrically isolates data line BDE from sense amplifier SA. This structure can prevent application of a high voltage to sense amplifier SA, which is formed of the thin film transistors. Accordingly, this structure can protect the films of the transistors, and therefore can protect the thin film transistors.

The operation for writing will now be described with reference to a timing chart of FIG. 5.

Figure 5:
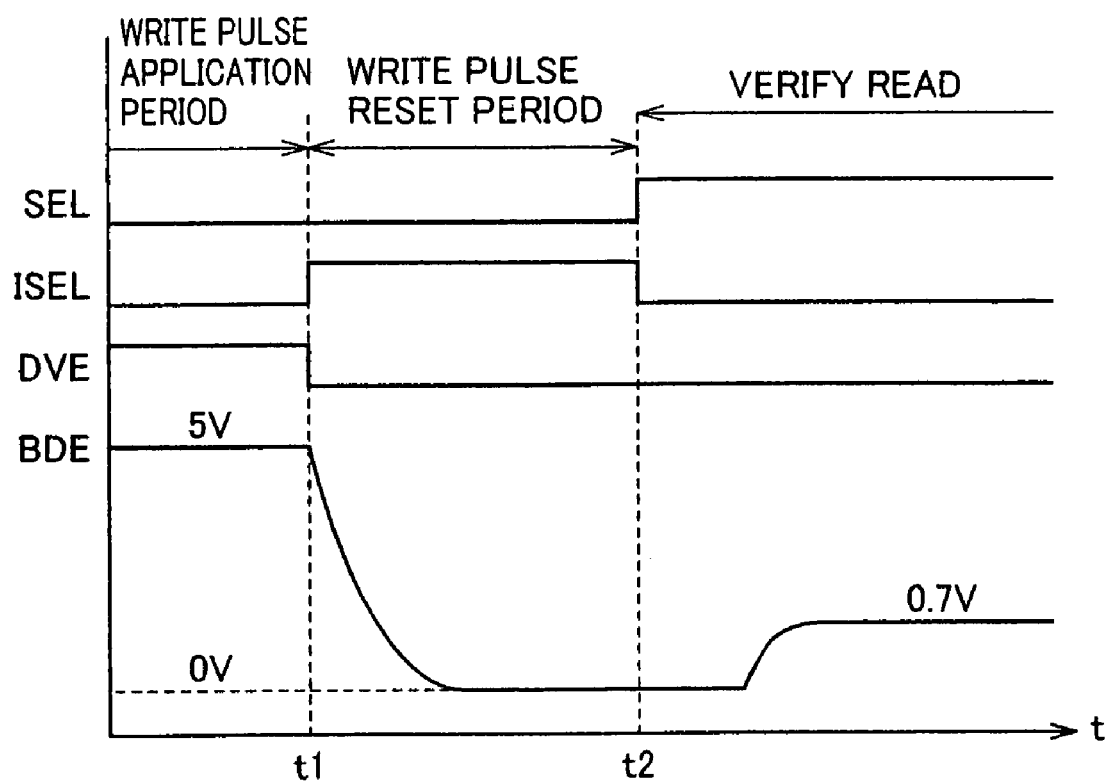
FIG. 5 is a timing chart illustrating operations in a write operation.

Referring to FIG. 5, a write pulse for executing the data writing is applied during a period before a time t1. In this state, control signals SEL and ISEL are at the "L" level. Therefore, transistor 61 is off, and electrically isolates data line BDE from sense amplifier SA. At time t1, application of the write pulse ends. Thereby, control signal DVE is set to the "L" level to deactivate write driver WDRV. Further, control signal ISEL is set to the "H" level. Thereby, transistor 62 is turned on. By this turn on, transistor 62 electrically couples ground voltage GND to data line BDE, and thus sets data line BDE to the ground voltage level of 0 V so that data line BDE is reset. When resetting is performed sufficiently at a time t2, control signal ISEL is set to the "L" level, and control signal SEL is set to the "H" level. Thereby, data line BDE is no longer coupled electrically to ground voltage GND, and is electrically coupled to sense amplifier SA so that a so-called verify read starts for determining whether an intended data write operation is executed or not.

An operation for erasing will now be described.

Referring to FIG. 3 again, voltage levels of word line WL and source line SL in memory array 70 change in an erase operation. Read/write control circuit 55 is inactive. More specifically, control signal SAE activating sense amplifier SA is set to 0V. Also, control signal DVE activating write driver WDRV is set to 0 V. Control signals CAU, CAL and SGL are set to 0 V, and the column select operation is not executed. Control signal SEL is set to 5 V ("H" level), and data line BDE is electrically coupled to sense amplifier SA. Since control signal RSTBD is set to 1.8 V ("H" level), data line BDE is electrically coupled to ground voltage GND, and thereby is reset. Word line WL and source line SL carry voltages of −10 V and 10 V, respectively, and well voltage PW of 10 V is set in the memory cell. Thereby, the erasing operation is executed by pulling out electrons, which was injected into the floating gate of memory cell MC, into the source region.

According to the first embodiment, as described above, transistor 61 electrically isolating sense amplifier SA from data line BDE is provided for preventing application of a high voltage to sense amplifier SA particularly in the write operation. Thereby, sense amplifier SA formed of the thin film transistors can be protected.

Second Embodiment

A second embodiment will now be described in connection with circuit structures of decoder units, which form a row decoder executing the row select operation, and word line drivers, which form word/source line driver band 65. This circuit structure may also be referred to as "row select circuitry" hereinafter.

Figure 6:
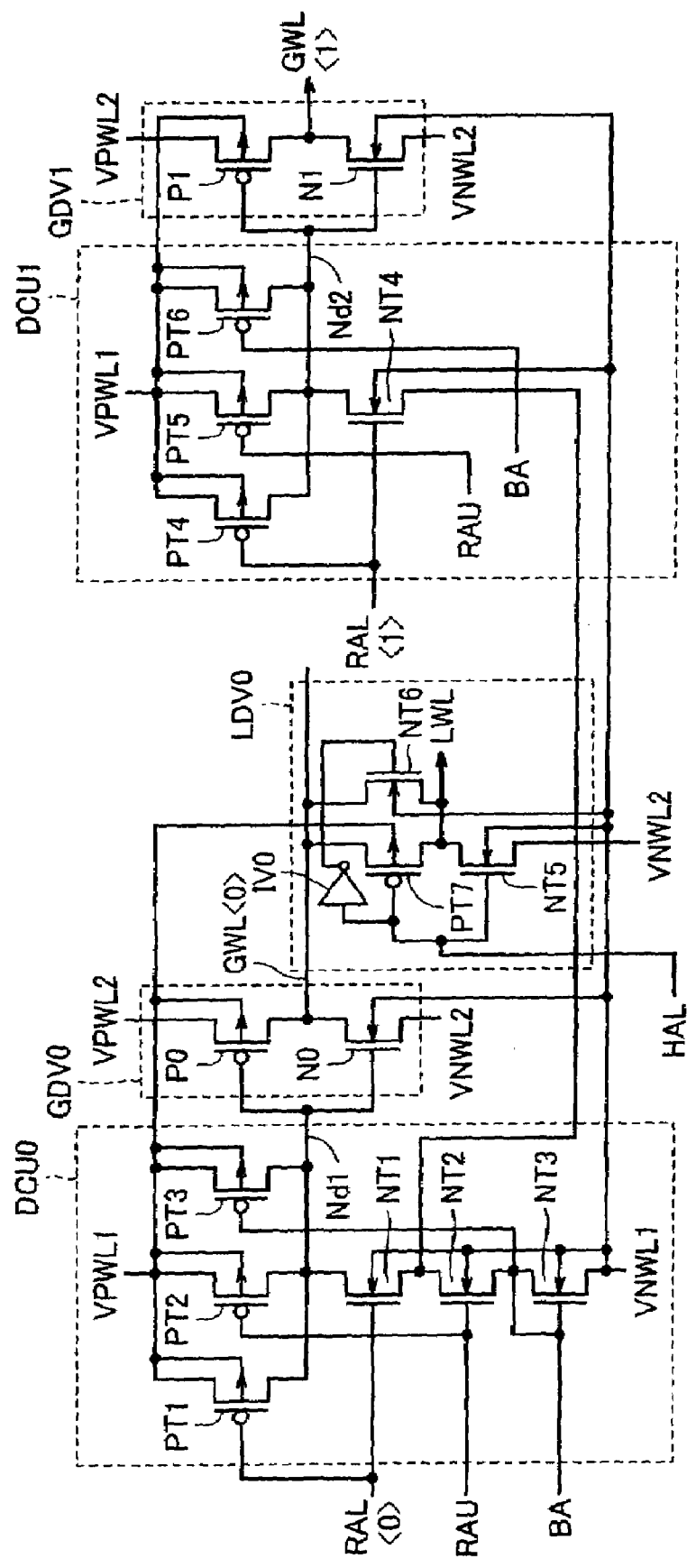
FIG. 6 shows a circuit structure of row select circuitry according to a second embodiment of the invention.

Referring to FIG. 6, the row select circuitry according to the second embodiment of the invention includes decoder units DCU0 and DCU1, word line drivers GDV0 and GDV1 driving global word lines GWL<0> and GWL<1>, respectively, and a word line driver LDV0 driving local word lines LWL. In the example, the word lines include global word lines GWL each provided for a group containing a predetermined number of memory cell rows, and local word lines LWL electrically coupled to global word lines GWL to form a hierarchical structure. In the specification, the global word lines and local word lines are collectively and simply referred to as "word lines WL".

Each of decoder units DCU0 and DCU1 receives a block select signal BA sent from row decoder 25a, a control signal RAU selecting the word line, and control signal RAL<0> or RAL<1>, and selects global word line GWL. Specific structures of the memory array will be described later.

Word line drivers GDV0 and GDV1 selectively drive global word lines GWL<0> and GWL<1> according to the control signals sent from decoder units DCU0 and DCU1, respectively. Word line driver LDV0 is electrically coupled to global word line GWL<0>, and selectively drives corresponding local word line LWL according to input of a control signal HAL. FIG. 6 shows, by way of example, one local word line LWL corresponding to global word line GWL<0>. Other global word lines GWL<1> have similar structures.

Decoder unit DCU0 includes transistors NT1-NT3 and PT1-PT3. Transistors NT1-NT3 are connected in series between a node Nd1 and voltage VNWL1, receive control signal RAL<0>, control signal RAU and block select signal BA on their gates, respectively. Transistors PT1-PT3 are connected in parallel between voltage VPWL1 and node Nd1, receive control signal RAL<1>, control signal RAU and block select signal BA on their gates, respectively. Decoder unit DCU0 forms a 3-input NAND circuit. For example, when all control signals RAL<0>, control signal RAU and block select signal BA are at the "H" level, all transistors NT1-NT3 are turned on to set node Nd1 to a level of voltage VNWL1. When one of control signal RAL<0>, control signal RAU and block select signal BA is at the "L" level, one of transistors PT1-PT3 is turned on so that node Nd1 is set to a level of voltage VPWL1.

Word line driver GDV0 includes transistors P0 and N0. Transistor P0 is arranged between voltage VPWL2 and global word line GWL<0>, and has a gate electrically coupled to node Nd1. Transistor N0 is arranged between voltage VNWL2 and global word line GWL<0>, and has a gate electrically coupled to node Nd1. For example, when node Nd1 is at the "H" level, transistor N0 is turned on, and the voltage level of global word line GWL<0> is set to voltage VNWL2. When node Nd1 is set to the "L" level, transistor P0 is turned on, and the voltage level of global word line GWL<0> is set to the level of voltage VPWL2.

Word line driver LDV0 includes transistors NT5, NT6 and PT7 and an inverter IV0. Transistor PT7 is arranged between local word line LWL and global word line GWL<0>, and has a gate receiving control signal HAL. Transistor NT6 is arranged between local word line LWL and global word line GWL<0> and in parallel with transistor PT7, and has a gate receiving an inverted signal of control signal HAL sent from inverter IV0. Transistor NT5 is arranged between local word line LWL and voltage VNWL2, and has a gate receiving control signal HAL. For example, when control signal HAL is at the "H" level, transistor NT5 is turned on to couple electrically voltage VNWL2 to local word line LWL. When control signal HAL is at the "L" level, transistors PT7 and NT6 are turned on to couple electrically local word line LWL to global word line GWL<0>.

Decoder unit DCU1 includes transistors PT4-PT6 and transistor NT4.

In decoder unit DCU1, transistor NT4 is electrically coupled in series to transistors NT2 and NT3 of decoder unit DCU0. More specifically, since control signal RAU and block select signal BA are sent to both decoder units DCU0 and DCU1, the transistors are shared so that the structure is formed of a reduced number of circuit parts. Transistors PT4-PT6 have substantially the same structures as those of transistors PT1-PT3 of decoder unit DCU0 already described, and have gates receiving control signal RAL<1>, control signal RAU and block select signal BA, respectively, Decoder unit DCU1 forms a 3-input NAND circuit. For example, when control signal RAL<1>, control signal RAU and block select signal BA are all at the "H" level, all transistors NT2-NT4 are turned on, and the voltage level of a node Nd2 is set to voltage VNWL1. When at least one of control signal RAL<1>, control signal RAU and block select signal BA is set to the "L" level, one of transistors PT4-PT6 is turned on so that node Nd2 is set to the level of voltage VPWL1.

Word line driver GDV1 includes transistors P1 and N1. A connection relationship of the transistors is substantially the same as that already stated in connection with global word line driver GDV0, and global word line GWL<1> is set to a predetermined voltage level according to the voltage level of node Nd2. In this example, transistors NT1-NT6, N0 and N1 are N-channel MOS transistors, and transistors PT0-PT7, P0 and P1 are P-channel MOS transistors.

Figure 7:
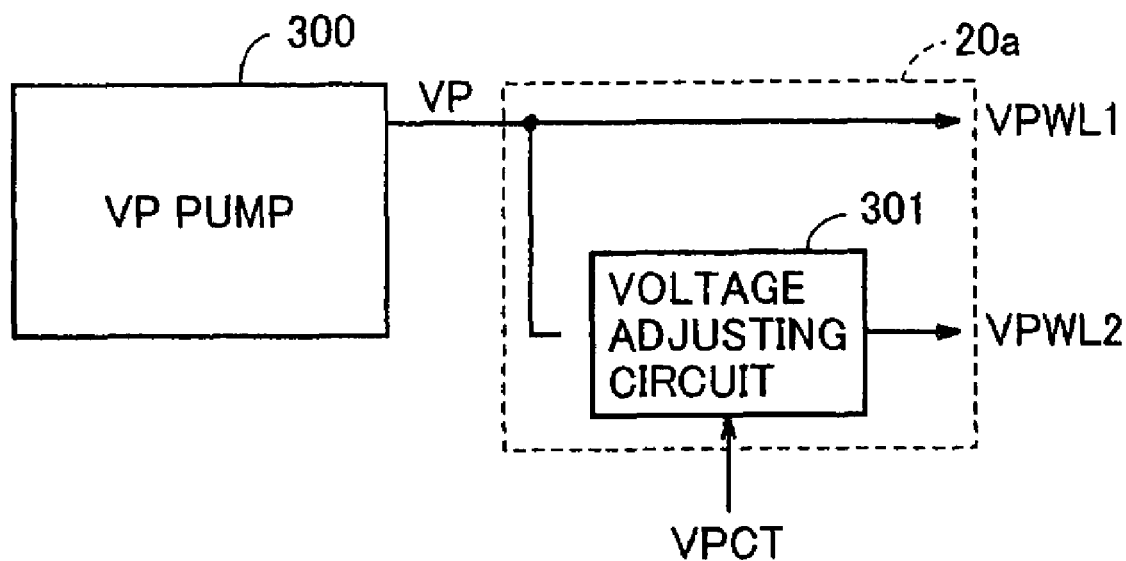
FIG. 7 is a schematic block diagram of a VP producing circuit and a VPWL distributor circuit.

Referring to FIG. 7, VP producing circuit 15c includes a VP pump 300 producing voltage VP. VPWL distributor circuit 20a receives voltage VP, and outputs voltages VPWL1 and VPWL2. VPWL distributor circuit 20a includes a voltage adjusting circuit 301, and provides voltage VPWL2 by adjusting the voltage level of voltage VP provided from VP pump 300 according to a control signal VPCT. VP pump 300 receives the voltage level of power supply voltage VCC (1.8 V), and provides voltage VP by boosting the received voltage to an intended voltage levels according to various operation sequences.

In a normal operation, VPWL distributor circuit 20a distributes received voltage VP to various circuits as voltages VPWL1 and VPWL2. Under certain conditions, i.e., when it receives control signal VPCT, however, VPWL distributor circuit 20a adjusts the voltage level of voltage VPWL2 for outputting it. It is assumed that control signal producing circuit 10d produces control signal VPCT in various operation sequences.

Structures and operations of VN producing circuit 15b and VNWL distributor circuit 20b providing voltages VNWL1 and VNWL2 are substantially the same as those described above.

Referring to FIG. 8, description will now be given on levels of voltages applied to the row select circuitry in various operation sequences according to the second embodiment of the invention.

Referring to FIGS. 6 and 8, voltages VPWL1 and VPWL2 are set to 5 V and (5 V−Vth) during standby, respectively. Voltages VNWL1 and VNWL2 are set to 0 V. In this example, Vth represents a threshold voltage of the transistor.

During standby, the word line is not selected so that the voltage on node Nd1 is set to the "H" level. Thus, at least one of control signal RAL<1>, control signal RAU and block select signal BA is at the "L" level so that at least one of transistors PT1-PT3 is turned on during standby. Thereby, node Nd1 is set to the voltage level (5 V) of voltage VPWL1. The source side of transistor P0, i.e., voltage VPWL2 is already set to (5 V−Vth). During standby, therefore, source side voltage VPWL2 of transistor P0 of the driver circuit in the final stage is set to a value lower than 5 V by a predetermined voltage. Thus, the source potential is set lower than the gate potential applied to the gate of transistor P0. Thereby, the channel leak current of transistor P0 can be sufficiently cut off to reduce a leak current. According to the above control system, the power consumption can be reduced by suppressing the leak current of the P-channel MOS transistors in the row select circuitry during standby according to the second embodiment of the invention. Although description have been given primarily on decoder unit DCU0 and word line driver GDV0, the above is true also with respect to decoder unit DCU1 and word line driver GDV1.

In the read operation, voltages VPWL1 and VPWL2 are set to 5 V. Voltages VNWL1 and VNWL2 are set to 0 V. Therefore, when decoder unit DCU0 is selected, i.e., when control signal RAL<0>, control signal RAU and block select signal BA are all at the "H" level, all transistors NT1-NT3 are turned on to set node Nd1 to the voltage level of 0 V. Thereby, transistor P0 of word line driver GDV0 is turned on, and selected global word line GWL<0> is set to the voltage level of 5 V. In response to the selection of global word line GWL<0>, one of local word lines LWL forming the hierarchical word line structure is selected according to control signal HAL, and the data is read from the memory cell electrically coupled to selected local word line LWL.

In the write operation, voltages VPWL1 and VPWL2 are set to 10 V. Voltages VNWL1 and VNWL2 are set to 0 V. For example, a select operation is performed similarly to the above operation so that transistors NT1-NT3 are all turned on to set the voltage level of node Nd1 to 0 V. Thereby, transistor P0 of word line driver GDV0 is turned on to set the voltage level of selected global word line GWL<0> to 10 V. Subsequent to the operation of selecting global word line GWL<0>, one of local word lines LWL forming the hierarchical word line structure is selected according to control signal HAL, and data is written into the memory cell electrically coupled to local word line LWL.

In the erase operation, voltages VPWL1 and VPWL2 are set to 0 V. Voltages VNWL1 and VNWL2 are set to −10 V. In the erase operation, transistor NT5 of word line driver LDV0 is turned on. One of control signal RAL<0>, control signal RAU and block select signal BA is at the "L" level. Thereby, the voltage level of node Nd1 is set to −10 V. Transistor P0 of word line driver GDV0 is turned on to set the voltage level of global word line GWL<0> to 0 V. Also, word line driver LDV0 receives control signal HAL (0 V). Thereby, transistor NT5 is turned on. Local word line LWL forming the hierarchical word line structure is selected according to control signal HAL, and voltage VNWL2 of −10 V is electrically coupled to local word line LWL. Thereby, the data erase operation is effected on the memory cell.

Description will now be given on an over-erase verify operation according to the embodiment of the invention.

Figure 9:
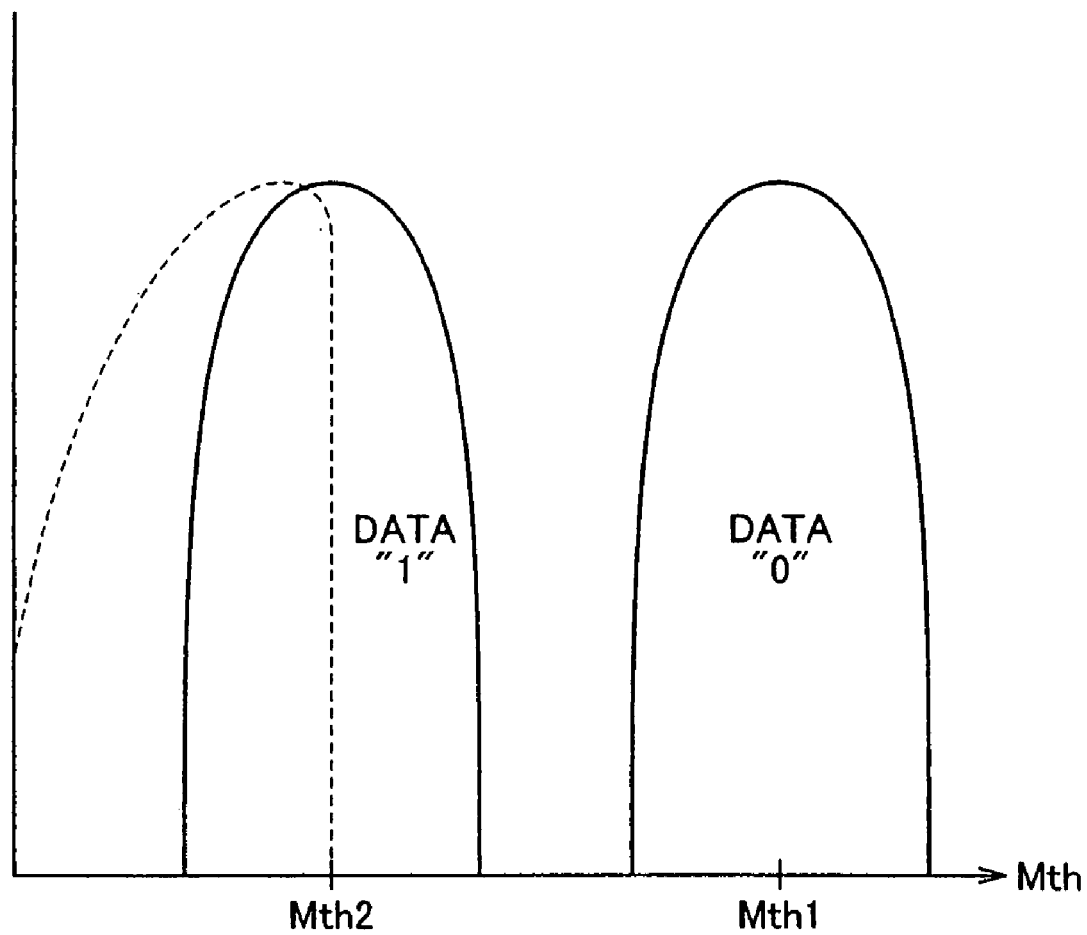
FIG. 9 illustrates a concept of threshold distributions of memory cells in an over-erased state.

Referring to FIG. 9, memory cells in the over-erased state exhibit threshold distributions described below.

Referring to FIG. 9, it is ideally desired as represented by solid lines that distributions with data of "0" and "1" converge to thresholds Mth1 and Mth2. In this example, threshold Mth1 corresponds to a programmed state, and threshold Mth2 corresponds to an erased state. In the over-erased state, as represented by dotted line, the threshold distributes in a range lower than threshold Mth2 of data "1". In this case, thresholds are low and vary to a large extent. Thus, a distribution width of the threshold voltage is large. From a comparison between the over-erased memory cell and the normally erased memory cell, the following can be apparent. When the over-erased memory cell becomes a depression transistor having a gate voltage of 0 V, i.e., even when the memory transistor is in the unselected state, a large leak current flows. When the memory cell in the above over-erased state is present, the verify or read operation causes such a situation that the unselected memory cell in the over-erased state causes a large amount of leak current on the same bit line, and therefore the current value of the selected memory cell cannot be detected due to a sum of such leak current. Thus, an unreadable state occurs. Therefore, the verify and read operations cannot be performed accurately.

Figure 10:
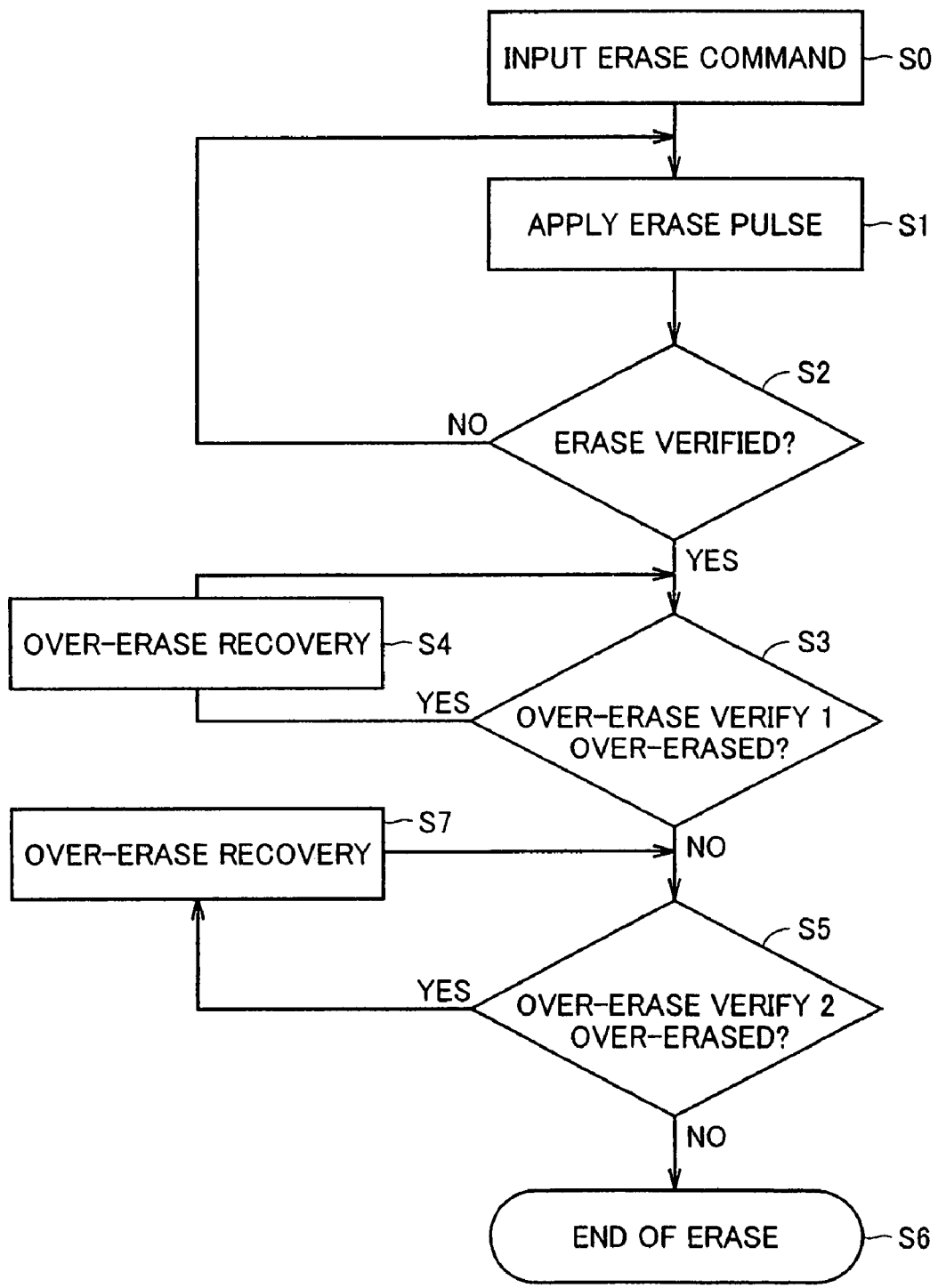
FIG. 10 is a flowchart of an erase sequence employing measures against a problem of over-erasing.

Referring to FIG. 10, description will now be given on an erase sequence employing measures against a problem of over-erasing represented by dotted line in FIG. 9.

Referring to FIG. 10, when an erase command is issued in a step S0, an erase pulse is applied in a step S1 so that an FN tunnel current changes the threshold voltage. In a next step S2, erase verify is executed. Steps S1 and S2 are repeated until erasing of all the selected memory cells is verified by the erase verify. When erasure of all the memory cells is verified in step S2, a next operation is performed in a step S3. In step S3, over-erase verify 1 is executed for verifying that memory cells are not over-erased. Thus, a memory cell having a threshold voltage lower than a certain value is detected after the end of the erase verify. When the over-erased memory cell is detected, a next operation is performed in a step S4, and over-erase recovery is performed.

The over-erase recovery is a function or operation of rewriting data into an over-erased memory cell by using Channel Hot Electrons (CHE), and thus a function or operation of positively increasing threshold voltages of individual memory cells. In step S3, it is determined again whether the memory cell is over-erased or not. When it is verified by over-erase verify 1 that the memory cells are not over-erased, a next operation is performed in a step S5, and over-erase verify 2 is executed. According to over-erase verify 2, the verify operation is executed under the same voltage conditions as those in the normal data read operation, and thereby it is determined whether the normal operation is performed or not. When it is determined by this over-erase verify 2 that the normal operation is not performed, a next operation is performed in a step S7 for over-erase recovery, and determination in step S5 will be repeated. When it is determined by this over-erase verify 2 that the memory cell is not over-erased, the erase processing is completed (step S6).

FIG. 8 also illustrates voltage levels applied to the row select circuitry in the over-erase verify operation.

In the over-erase verify 1, voltage VPWL1 is set to 5 V, and voltage VPWL2 is set to 1.5 V. Both voltages VNWL1 and VNWL2 are set to −2 V. In this example, it is assumed that global word line GWL<0> is selected. More specifically, control signal RAL<0>, control signal RAU and block select signal BA are all set to the "H" level. Thereby, node Nd1 is set to the voltage of −2 V, transistor P0 is turned on, and global word line GWL<0> is set to 1.5 V. Unselected global word line GWL<1> is set to −2 V. Thereby, the verify operation and thus the data read operation are executed, and over-erase verify 1 is performed. In this case, unselected global word line GWL<1> is set to −2 V, and local word line LWL (not shown) electrically coupled to global word line GWL<1> is set to the voltage of −2 V. According to these voltage levels, a leak current of the unselected memory cell can be reliably cut off, and the verify operation can be executed stably.

In over-erase verify 2, the voltage levels and operations are similar to those already described except for that voltage VNWL2 is set to 0 V instead of −2 V. Thus, the voltage level of unselected global word line GWL<1> is set to 0 V instead of −2 V. In the case, the verify operation is executed under substantially the same situations as the normal data read operation. Thus, under the substantially same conditions as those for reading, the verify operation can be executed so that the over-erased memory cell can be eliminated more reliably according to the foregoing manner.

In the verify operation, a low operation voltage of 1.5 V is supplied to global word line GWL<0> selected by using transistor P0 in contrast to the standby state as well as the read and write operations. In this case, lowering of the substrate may affect the threshold voltage of transistor P0 to raise it so that it may be difficult to supply an intended operation voltage of 1.5 V to global word line GWL<0>. According to the manner employed in this example, therefore, voltage VNWL1 is set to −2 V for ensuring an intended drive capability. Thereby, node Nd1 is set to −2V so that the drive capability of transistor P0 rises, and the operation voltage can be reliably supplied to the global word line although it is low.

Figure 11:
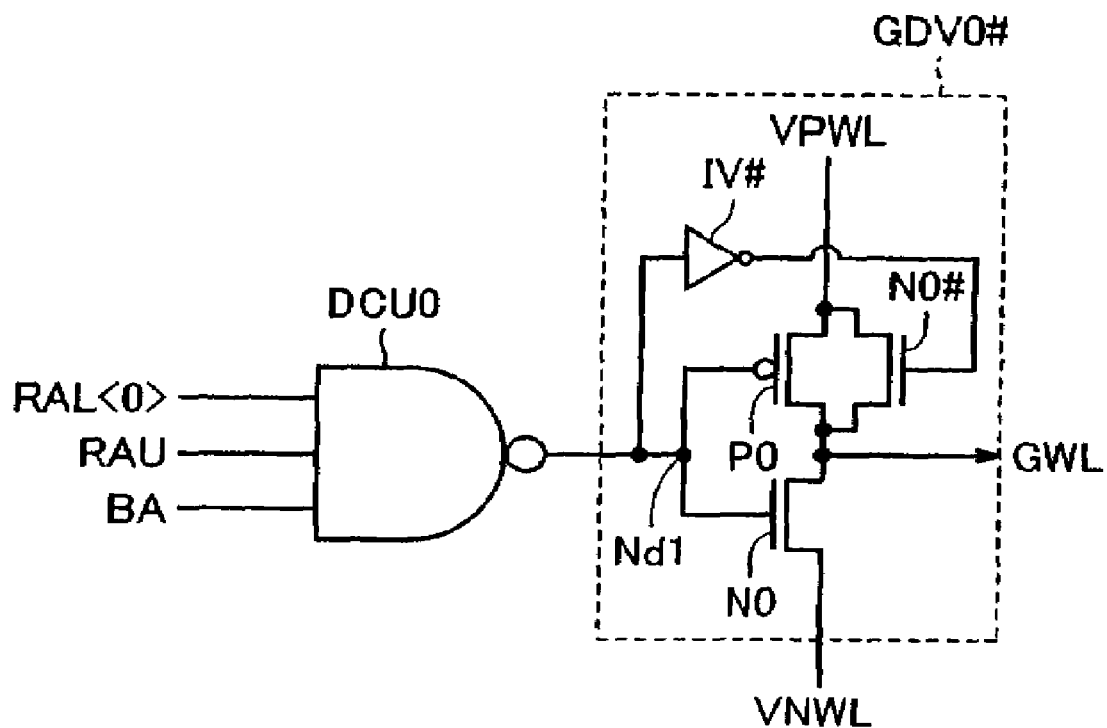
FIG. 11 shows a circuit structure of conventional column select circuitry.

FIG. 11 shows conventional column select circuitry, and particularly shows a word line driver GDV0# driving global word line GWL according to control signal RAL<0>, control signal RAU and block select signal BA. Decoder unit DCU0 is substantially the same as that shown in FIG. 6, and therefore description thereof is not repeated.

As shown in FIG. 11, power supply voltage VPWL of a low operation voltage is supplied to global word line GWL. In this case, such a structure is employed that includes, in addition to P-channel MOS transistor P0, an inverter IV#, which receives the voltage level of node Nd1 and provides an inverted signal thereof, and an N-channel MOS transistor N0# receiving on its gate an output signal of inverter IV#. Therefore, by lowering a gate voltage to be supplied to node Nd1, the drive capability of the P-channel MOS transistor can be increased, and the intended voltage level can be supplied to global word line GWL even when the operation voltage is low. According to the structure of this embodiment, it is not necessary to use inverter IV# and N-channel MOS transistor N0# required in the conventional structure. Therefore, it is possible to reduce a circuit area and the number of circuit parts so that a layout efficiency can be high.

Description will now be given on sectional structures of the transistors used in the column select circuitry.

Figure 12:
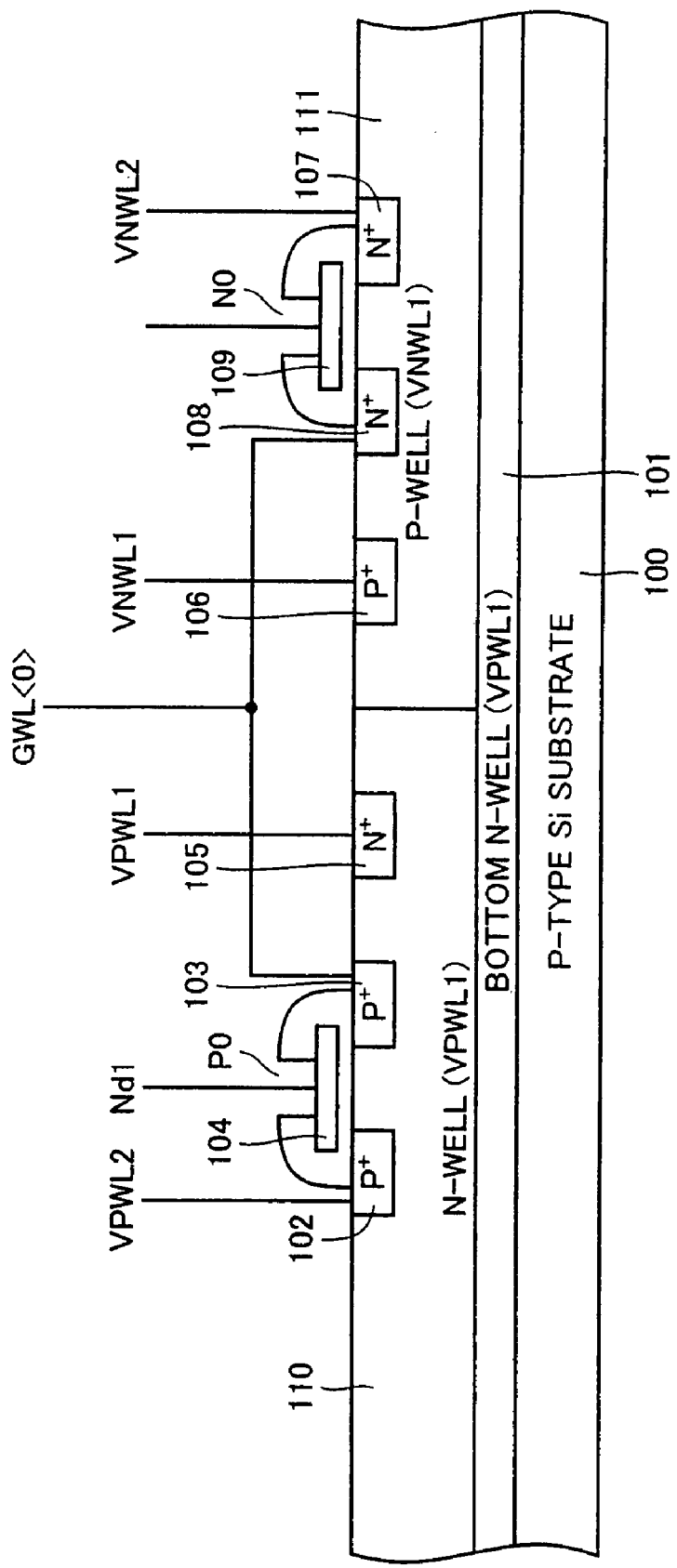
FIG. 12 shows sectional structures of transistors forming a driver circuit.

FIG. 12 shows, by way of example, transistors N0 and P0.

A bottom N-well 101 is formed at a layer above a P-type silicon substrate 100. N- and P-wells 110 and 111 are layered on bottom N-well 101. P-channel MOS transistor (P-type field-effect transistor) P0 is formed at N-well 110 (PMOS region). More specifically, P-type (P+) impurity regions 102 and 103 are formed as a source and a drain of transistor P0, respectively. The source side of transistor P0 is electrically coupled to voltage VPWL2, and the drain side thereof is electrically coupled to global word line GWL<0>. A gate electrode 104 is electrically coupled to node Nd1. Further, an N-type (N+) impurity region 105 is formed in N-well 110, and is electrically coupled to voltage VPWL1.

Transistor N0, i.e., N-channel MOS transistor (N-type field-effect transistor) N0 is formed in P-well 111 (NMOS region). More specifically, impurity regions 106-108 are formed in the P-well, and P-type (P+) impurity region 106 supplied with a well voltage in the P-well is electrically coupled to voltage VNWL1. N-type impurity region 107 on the source side of N-channel MOS transistor N0 is electrically coupled to voltage VNWL2, and impurity region 108 on the drain side is electrically coupled to global word line GWL<0>. A gate electrode 109 is electrically coupled to node Nd1.

In the structure of this embodiment, the N-well is formed by merging the NMOS and PMOS regions. Thus, the NMOS and PMOS regions are formed on the common bottom N-well so that the layout thus formed can reduce an area.

Further, the above structure can suppress a potential difference between P- and N-wells in the NMOS region during the erase operation, and thus can relieve the voltage.

Third Embodiment

A third embodiment of the invention will now be described in connection with a driver structure of a gate select circuit CASG executing the column select operation and a column decoder controlling the gate select circuit. These gate select circuit CASG and the column decoder may be referred to as "column select circuitry" hereinafter.

Figure 13:
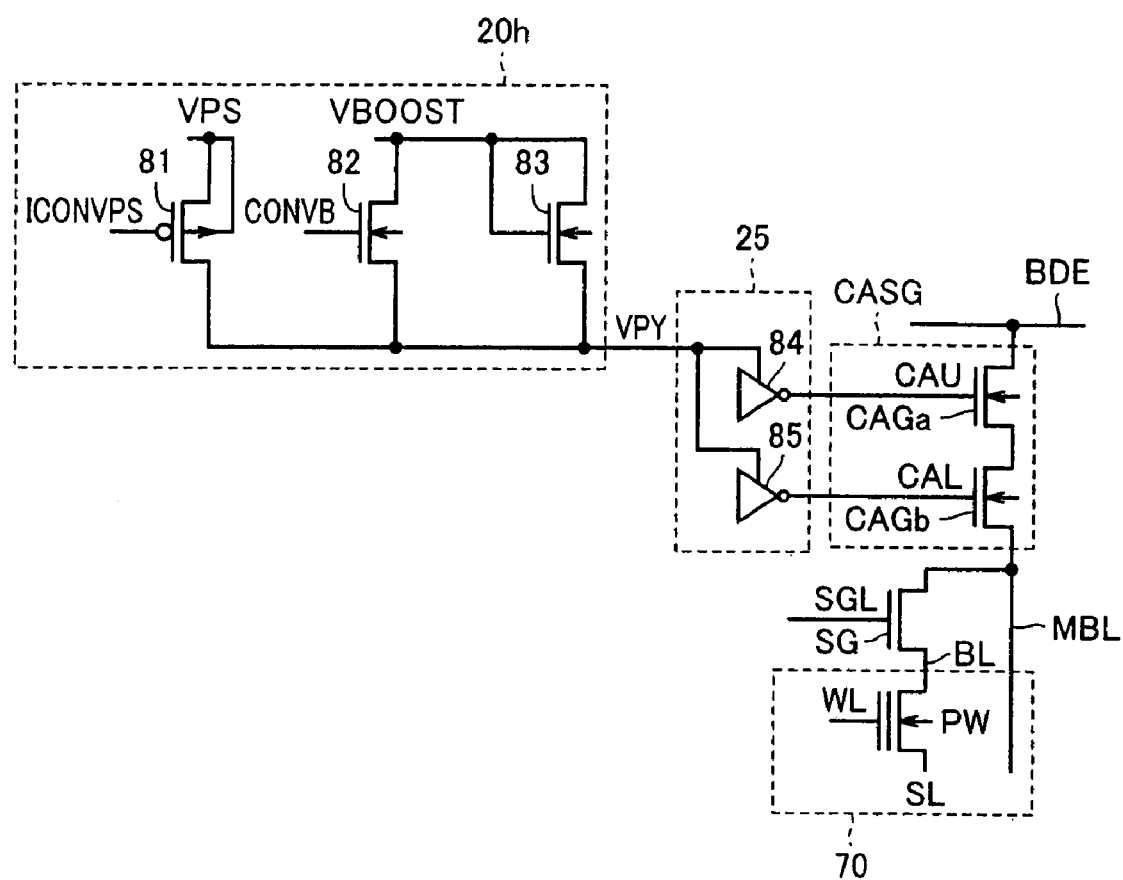
FIG. 13 shows a structure of column select circuitry according to a third embodiment of the invention.

Referring to FIG. 13, the column select circuitry according to the third embodiment includes a gate select circuit CASG, a column decoder 25 issuing control signals CAU and CAL, and a VPY voltage producing circuit 20h providing a power supply of a driver in a final stage of column decoder 25.

Column decoder 25 includes driver circuits 84 and 85, which are arranged in the final stage of the paths transmitting control signals CAU and CAL to column select gate CASG. Driver circuits 84 and 85 use voltage VPY as their operation voltages.

VPY voltage producing circuit 20h includes transistors 81-83. Transistor 81 is arranged between voltage VPS and the power supply line supplying voltage VPY, and has a gate receiving a control signal ICONVPS. Transistor 82 is arranged between voltage VBOOST and the power supply line supplying voltage VPY, and has a gate receiving a control signal CONVB. Transistor 83 is diode-connected, and has a source and a gate electrically coupled to voltage VBOOST as well as a drain electrically coupled to the power supply line supplying voltage VPY. Transistor 81 is a P-channel MOS transistor. Transistors 82 and 83 are N-channel MOS transistors. Voltage VBOOST corresponds to a word line boosted voltage, which is applied to word line WL electrically coupled to the gate of the memory cell in the data read operation.

Referring to FIG. 14, description will now be given on the voltage levels applied to the column select circuitry according to the third embodiment of the invention in various sequences.

In the read operation, both voltages VPS and VBOOST in VPY voltage producing circuit 20h are set to 5 V. Control signal ICONVPS is set to 5 V, and control signal CONVB is set to 0 V. Therefore, both transistors 81 and 82 are off, and voltage VPY is set to (5 V−Vth), which is lower than voltage VBOOST (5 V) by the threshold voltage of transistor 83. Driver circuits 84 and 85 of column decoder 25 use voltage VPY as the operation voltages, and provide control signals CAU and CAL to column select circuit CASG, respectively. Data line BDE is set to 0.7 V by the precharge operation of sense amplifier SA already described. Since control signals CAU, CAL and SGL are set to 5 V as described above, memory cell MC is electrically coupled to data line BDE via bit line BL and main bit line MBL. Memory cell MC has been electrically coupled to source line SL set to 0 V. Thereby, a current path is formed in response to word line WL (5 V), and the data read operation is executed.

In the above manner, voltages higher than normal power supply voltage VCC (1.8 V) are applied to gates of transistors CAGa and CAGb of column select circuit CASG so that the drive capability of the transistors are improved, and the voltages can be reliably supplied to main bit line MBL and bit line BL. Further, voltage VPY is set to (5 V−Vth), which is lower than the voltage by the threshold voltage, by employing the diode connection. The voltage level of voltage VPY is higher than device power supply voltage VCC (1.8 V), but is lower than high voltage VBOOST (5 V) by the threshold voltage. Although the above structure employs transistor 83 for controlling the voltage level, another structure or manner such as provision of resistances may be employed for controlling the voltage level.

In the write operation, voltage VPS is set to 10 V. Control signal ICONVPS is set to 0 V. Thereby, VPY voltage producing circuit 20h turns on transistor 81 to set voltage VPY to 10 V. Driver circuits 84 and 85 of column decoder 25 use voltage VPY as their operation voltages, and provide control signals CAU and CAL to column select circuit CASG. In some cases, write driver WDRV sets data line BDE to 5 V depending on the write data. In such cases, the high voltage of 5 V can be reliably supplied to main bit line MBL and bit line BL for applying a high voltage to column select circuit CASG.

Figure 15:
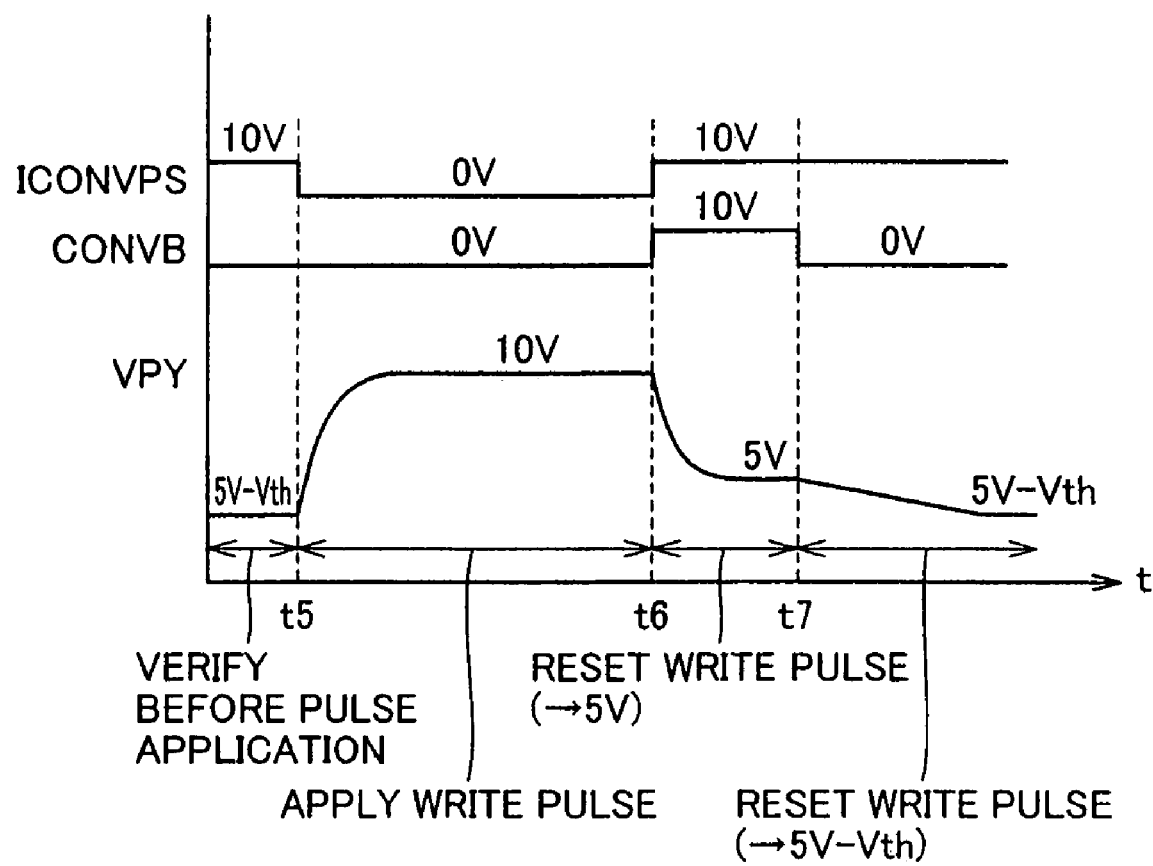
FIG. 15 is a timing chart illustrating a voltage produced by a VPY voltage producing circuit in accordance with an operation of the column select circuitry in a write operation.

Referring to FIG. 15, description will now be given on voltage VPY, which is produced by VPY voltage producing circuit 20h according to the operation of the column select circuitry in the write operation.

Referring to FIG. 15, voltage VPY is set to (5 V−Vth) in the verify operation before a time T5. At time T5, control signal ICONVPS is set to 0 V for write pulse application. Thereby, transistor 81 is turned on as described above, and voltage VPY of 10 V, i.e., the voltage at the level of voltage VPS is applied as the operation voltage to the driver circuit of column decoder 25. In this case, control signal CONVB is 0 V. At a time T6, the write pulse application ends so that control signal ICONVPS is set to 10 V, and transistor 81 is turned off. Control signal CONVB is set to 5 V, and transistor 82 is on. Thereby, voltage VPY is set to 5 V. At a next time T7, control signal CONVB is set to 0 V. Thereby, transistor 82 is turned off, and voltage VPY gradually lowers and will be kept at (5 V−Vth), which is lower than voltage VPY by the threshold voltage of transistor 83.

The above structure employs a two-stage reset manner, in which the voltage level of voltage VPY is changed from 10 V to 5 V, and then is reset from 5 V to (5 V−Vth) during the reset period.

In the erase operation, the voltage levels of word line WL and source line SL in memory array 70 change. More specifically, a word line WL is set to −10 V, source line SL is set to 10 V and well voltage PW is set to 10 V as described above. The column select circuitry is inactive. More specifically, control signals CAU and CAL are set to 0 V ("L" level) as described before so that data line BDE is electrically isolated from main bit line MBL.

According to the third embodiment, as described above, the high voltage is applied to the gates of transistors CAGa and CAGb of column select circuit CASG so that the drive capability of the transistors is improved, and the intended voltages can be reliably supplied to main bit line MBL and bit line BL.

Fourth Embodiment

A fourth embodiment will now be described in connection with a manner of ensuring a sufficient capability of the source line driver and reinforcing its drive capability.

Figure 16:
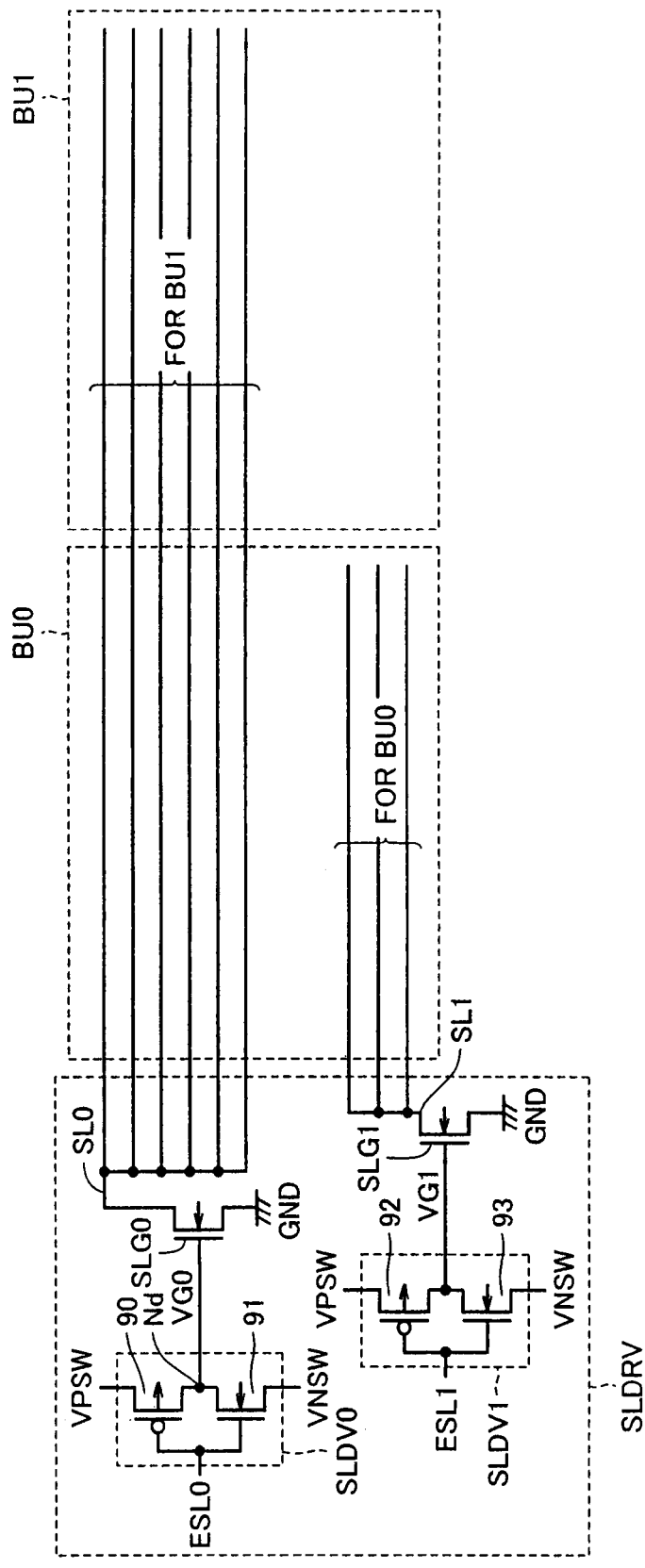
FIG. 16 illustrates a concept of a manner of reinforcing a drive capability of a source line driver.

FIG. 16 shows, by way of example, a source line driver band SLDRV and two blocks BU0 and BU1 defined by dividing the memory array into two.

Source line driver band SLDRV includes source line drivers SLDV0 and SLDV1 as well as drive transistors SLG0 and SLG1, which are provided corresponding to blocks BU0 and BU1 formed by dividing the memory array, respectively.

Source line driver SLDV0 includes transistors 90 and 91. Transistor 90 is arranged between voltage VPSW and a node Nd, and has a gate receiving a control signal ESL0. Transistor 91 is arranged between node Nd and voltage VNSW, and has a gate receiving control signal ESL0. For example, transistors 90 and 91 are P- and N-channel MOS transistors, respectively. One of transistors 90 and 91 is turned on in response to control signal ESL0, and thereby supplies, as a control signal VG0, corresponding one of voltages VPSW and VNSW to driver transistor SLG0. Driver transistor SLG0 is arranged between a source line SL0 and ground voltage GND, and has a gate receiving control signal VG0.

Source line driver SLDV1 includes transistors 92 and 93, and a connection relationship between them is similar to that for source line driver SLDV0. More specifically, one of transistors 92 and 93 is turned on in response to a control signal ESL1, and thereby supplies, as a control signal VG1, corresponding one of voltages VPSW and VNSW to driver transistor SLG1. Driver transistor SLG1 is arranged between source line SL1 and ground voltage GND, and has a gate receiving control signal VG1. Transistors 92 and 93 are P- and N-channel MOS transistors, respectively. In this structure, voltage VPSW (5 V) is applied. By applying the high voltage of 5 V to drive the source line driver, control signals VG0 and VG1 can ensure a sufficient drive capability of driving source line SL0. Voltage VPSW is at the same level as the word line boosted voltage, which is applied to word line WL electrically coupled to the gate of the memory cell in the data read operation.

Further, according to the fourth embodiment, source lines SL provided for block BU0 are different in number from those provided for block BU1. More specifically, as shown in FIG. 16, six source lines SL0 are provided for block BU1, which is remote from source line driver band SLDRV, and three source lines SL1 are provided for block BU0 located near source line driver band SLDRV. As will be described later in detail, source lines SL0 and SL1 generally represent, e.g., six source lines SL and three source lines SL among the nine source lines, which are arranged in the row direction and each correspond to a predetermined number of memory cell rows.

According to this structure, the source lines provided for neighboring block BU0 are different in number from those provided for remote block BU1. Thereby, even if the source lines provided for block BU1 are long, a sufficient drive capability for driving source line SL0 can be ensured by increasing the number of source lines and thereby keeping the low line resistance.

The source lines provided for remote block BU1 may be thicker than those for block BU0, whereby the source voltage can be supplied more efficiently. More specifically, the width of the source line can be enlarged in accordance with the length of the source lines.

Fifth Embodiment

A fifth embodiment will now be described in connection with a structure or a manner for suppressing noises, which may affect the data line electrically coupled to sense amplifier 2.

Figure 17:
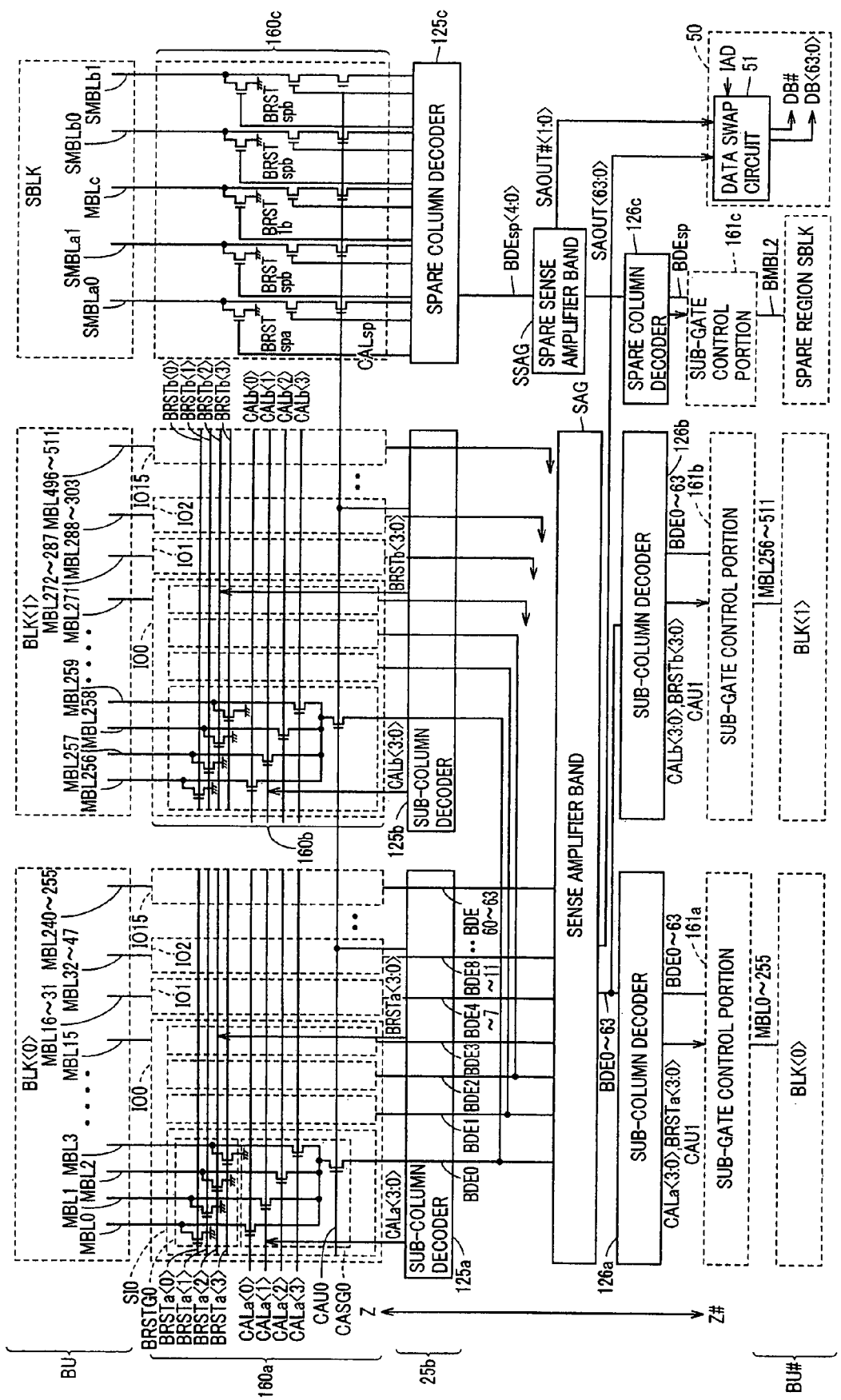
FIG. 17 specifically shows structures of a memory array and its periphery circuit according to an embodiment of the invention.

Referring to FIG. 17, memory array 70 according to the fifth embodiment of the invention has two blocks BU and BU# each having memory regions BLK<0> and BLK<1> and a spare region SBLK for a redundant purpose. Blocks BU and BU# have similar structures, and the following description will be given primarily on block BU.

Memory region BLK<0> has main bit lines MBL0-MBL255. Memory region BLK<1> has main bit lines MBL256-MBL511. Spare region SBLK has spare main bit lines SMBLa0, SMBLa1, SMBLb0 and SMBLb1 as well as a main bit line MBLc.

Figure 18:
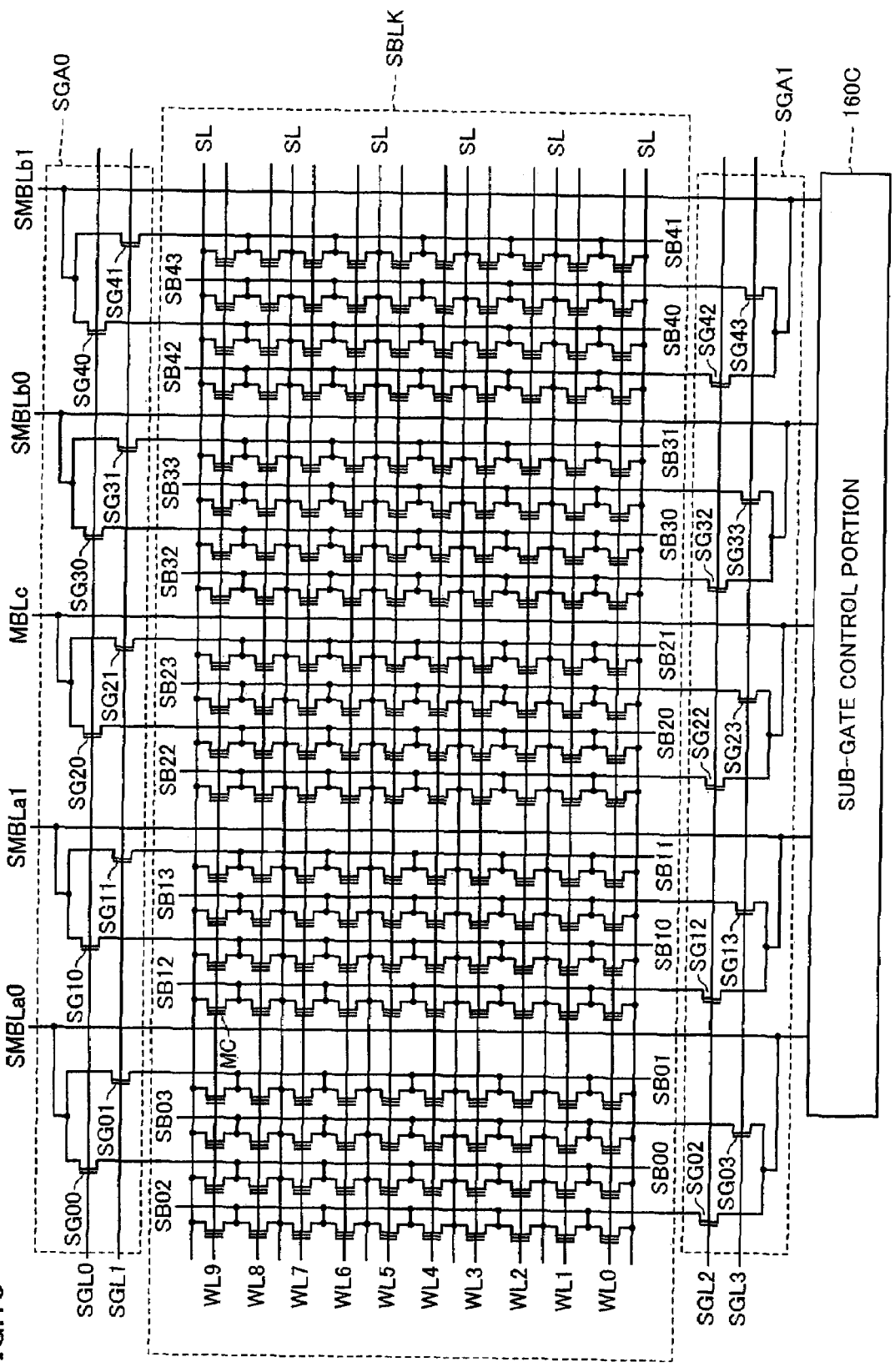
FIG. 18 specifically illustrates a concept of a spare region of the memory array.

Referring to FIG. 18, spare region SBLK in memory array 70 has a plurality of memory cells MC arranged in rows and columns, a plurality of word lines WL provided corresponding to the memory cell rows, respectively, a plurality of source lines SL each provided corresponding to a predetermined number of memory cell rows, a plurality of bit lines SB provided corresponding to the memory cell columns, respectively, and a plurality of main bit lines MBL each provided corresponding to four memory cell columns. FIG. 18 shows, by way of example, word lines WL0-WL9 provided corresponding to memory cell rows, respectively. Although the bit lines BL have been described, this structure employs similar bit lines, which are represented as bit lines SB00-SB03, SB10-SB13, SB20-SB23, SB30-SB33 and SB40-SB43. This structure is also provided with source lines SL each provided corresponding to, e.g., two memory cell rows. Since these structures are arranged in spare region SBLK, main bit lines MBL used as redundant bit lines are represented as spare main bit lines SMBLa0, SMBLa1, SMBLb0 and SMBLb1. Main bit lines MBLc is a main bit line for a lock bit, and does not correspond to a memory cell storing special information.

Gate transistor regions SGA0 and SGA1 are located on the opposite sides of spare region SBLK, respectively. Each of gate transistor regions SGA0 and SGA1 has a plurality of gate transistors SG controlling connection to spare main bit line SMBL or MBL.

Gate transistor regions SGA0 and SGA1 include gate transistors SG00-SG43. Specific description will now be given, by way of example, on spare main bit line SMBLa0 corresponding to four bit lines SB00-SB03.

Gate transistor regions SGA0 and SGA1 include gate transistors SG provided corresponding to respective bit lines SB. In FIG. 18, gate transistors SG00, SG01 and SG02 correspond to bit lines SB00, SB01 and SB02, respectively. Gate transistors SG00-SG03 receive control signals SGL0-SGL3 (which may be generally referred to as "control signals SGL") on their gates, respectively. In this structure, the gate transistors arranged in each of gate transistor regions SGA0 and SGA1 correspond to alternate memory cell columns, respectively. Other bit lines SB and spare main bit lines SMBL have substantially the same structures. This structure can ensure a sufficiently large distance between the gate transistors, and thus can increase a layout margin. Spare main bit lines SMBL and main bit lines MBL are electrically coupled to a sub-gate control portion 160c via gate transistors SG.

Although spare region SBLK having spare main bit lines SMBLa0, SMBLa1, SMBLb0 and SMBLb1 as well as main bit line MBLc has been described, memory regions BLK<0> and BLK<1> have similar array structures although the number of main bit lines are different from the above.

Referring to FIG. 17 again, memory region BLK<0> has main bit lines MBL0-MBL255, which are provided corresponding to the memory cell columns, respectively, and are divided into a plurality of sets each including four main bit lines. Each data line BDE is provided to the bit line set including the four bit lines so that data lines BDE0-BDE63 are arranged.

In addition to gate transistors SG arranged in gate transistor regions SGA0 and SGA1 already described, gate control portion 60 includes sub-gate control portions 160a, 160b and 160c, which correspond to memory region BLK<0>, memory region BLK<1> and spare memory region SBLK, respectively, and can control electrical connection to a sense amplifier band SAG. Gate control portion 60 also includes sub-gate control portions 161a, 161b and 161c provided corresponding to memory region BLK<0>, memory region BLK<1> and spare memory region SBLK of block BU#, respectively.

Sub-gate control portion 160a includes 16 gate control units IO0-IO15. Thus, gate control units IO are provided corresponding to the 16 main bit lines, respectively. Each gate control unit IO is formed of four sub-control units SIO, and each sub-control unit SIO is provided corresponding to a set of four bit lines.

Sub-control unit SIO includes a reset unit BRSTG0 and gate select circuit CASG0.

Reset unit BRSTG0 is responsive to control signals BRSTa<0>-BRSTa<3> at the "H" level, and electrically couples corresponding bit lines MBL0-MBL3 to ground voltage GND to reset them to 0 V.

Gate select circuit CASG0 is responsive to control signals CALa<0>-CALa<3> and CAU0, and can electrically couples one of main bit lines MBL0-MBL3 to corresponding to data line BDE. The description already given on control signals CAL and CAU generally and briefly represents these control signals CALa<0>-CALa<3> and CAU0.

In this structure, gate control unit IO0 transmits a 4-bit data signal to data lines BDE0-BDE3 according to control signals CAL and CAU. As a whole, therefore, sub-gate control portion 160a transmits the 64-bit data signal to the sense amplifier band via data lines BDE0-BDE63.

Description will now be given on sub-gate control portion 160b for memory region BLK<1>. Sub-gate control portion 160b has substantially the same structure as sub-gate control portion 160a, and can execute the column selecting operation similar to that already described by issuing control signals CALb<3:0> and BRSTb<3:0> from a sub-column decoder 126b instead of control signals CALa<3:0> and BRSTa<3:0> issued from a sub-column decoder 126a.

More specifically, gate control units IO0-IO15 of sub-gate control portion 160b transmit 64-bit data signals to data lines BDE0-BDE63.

In this structure, memory regions BLK<0> and BLK<1> share sense amplifier SA provided in sense amplifier band SAG, and sub-gate control units SIO in each memory region BLK share data line BDE.

The data signal transmitted to sense amplifier band SAG is amplified and sent as read data SAOUT<63:0> to data output circuit 50.

For spare region SBLK, sub-gate control portion 160c is provided corresponding to spare region SBLK. Spare region SBLK has spare main bit lines SMBLa0, SMBLa1, SMBLb0 and SMBLb1 as well as main bit line MBLc as already described, and sub-gate control portion 160c selects spare bit line SMBL or main bit line MBL in response to control signals CALsp and CAU0. Control signals CALsp generally represents signals selecting spare bit lines SMBL and main bit line MBL. Main bit line MBLc is the main bit line for the so-called lock bit as already described. Therefore, main bit line MBLc is not used for an ordinary redundant operation, and transmits a predetermined data signal in accordance with a predetermined command. In this example, main bit line MBLc is arranged between spare bit lines SMBLa and SMBLb. In this example, a spare column decoder 125c executes the redundant replacement operation by selecting, in parallel, one of two spare bit lines SMBLa and one of two spare bit lines SMBLb.

Spare bit lines SMBLa0 and SMBLa1, main bit line MBLc and spare bit lines SMBLb0 and SMBLb1 are electrically coupled to data lines BDEsp0-BDEsp4, respectively.

In accordance with internal address IAD, spare column decoder 125c selects two spare bit lines from four spare bit lines SMBLa0, SMBLa1, SMBLb0 and SMBLb1 in spare block SBLK, and transmits the data signal to a spare sense amplifier band SSAG.

In this structure, spare sense amplifier band SSAG has two sense amplifiers SA, and provides read data SAOUT#<1:0> to data output circuit 50.

Data output circuit 50 includes a data swap circuit 51, which substitutes a part of bits in normal read data SAOUT<63:0>, which is read from memory region BLK, with read data SAOUT#<1:0> read from spare region SBLK in accordance with internal address IAD.

Bit line MBLc for the lock bit in this structure is the bit line for transmitting special data in response to a special command, and is not selected in a usual state. For reading out special data such as lock bit information, therefore, other spare bit lines SMBL are reset in accordance with input of control signals BRSTspa and BRSTspb ("H" level). Therefore, an influence of coupling noises is suppressed. Conversely, bit line MBLc is reset in a normal access operation. Therefore, even when spare bit lines SMBLa1 and SMBLb0 are simultaneously selected, bit line MBLc arranged between them serves as a shield line, and suppresses coupling noises.

Figure 19:
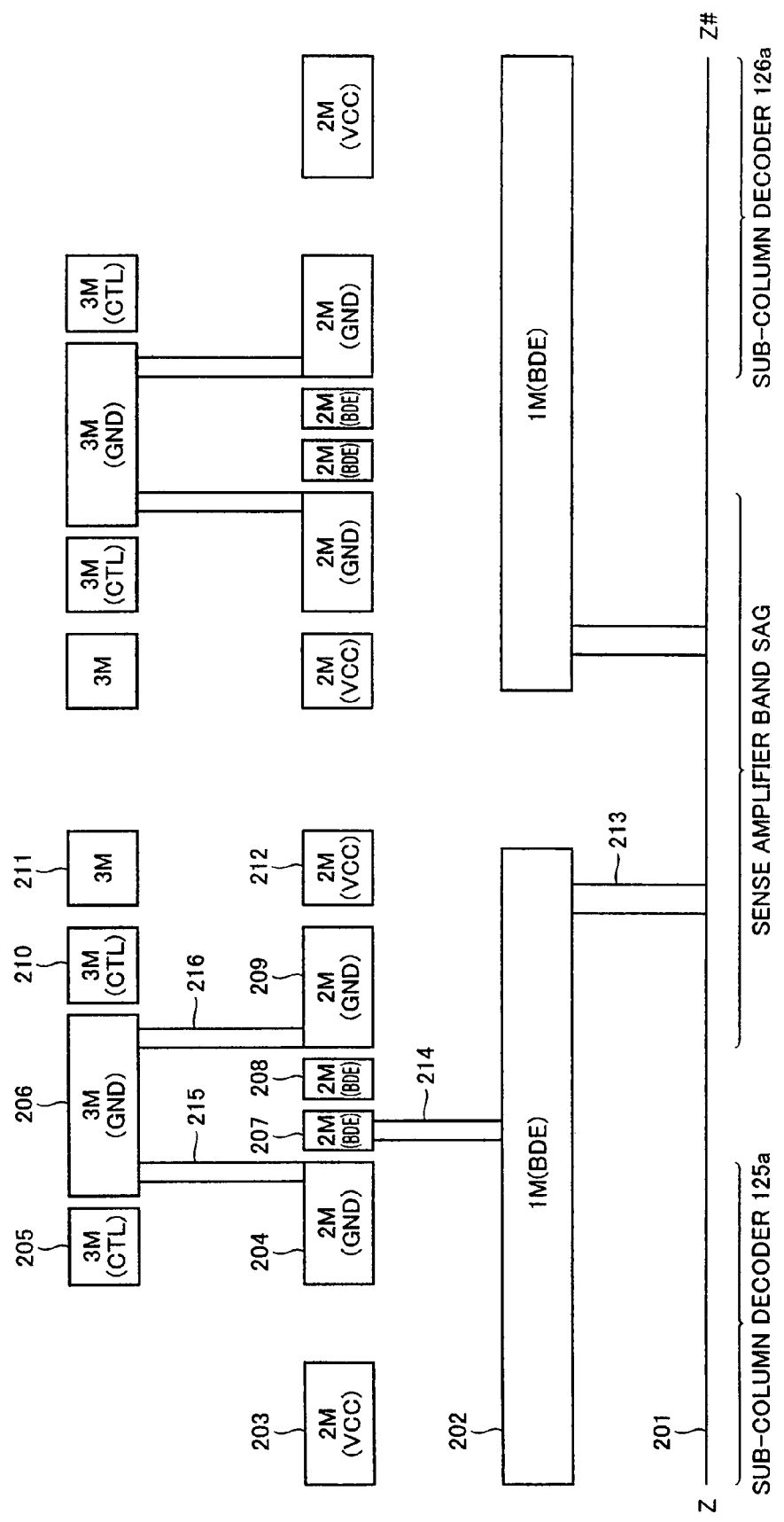
FIG. 19 shows a sectional structure, and particularly illustrates an interconnection structure electrically coupling data lines to a sense amplifier band between Z and Z#.

Referring to FIG. 19, description will now be given on a structure for suppressing coupling noises of data line BDE. Although FIG. 19 shows structures related to sub-column decoders 125a and 126a, these structures are the same, and therefore the structure related to sub-column decoder 125a will now be described.

As shown in FIG. 19, data line BDE extending from memory region BLK<0> is formed at a metal interconnection layer 202, which is a first layer (1M) above sub-column decoder 125a formed on a substrate 201, and which is electrically coupled with the sense amplifier band SAG via contact hole 213. A power supply line supplying voltage VCC for use by sub-column decoder 125a is formed at a metal interconnection layer 203, which is a second layer (2M) above the first layer (1M). A ground line supplying ground voltage GND for use by a sub-column decoder 204 is formed at a metal interconnection layer 204, which is also provided by the second layer (2M). A control line transmitting a control signal CTL to be used by the sub-column decoder is formed at a metal interconnection layer 205 formed of a third layer (3M) above the second layer (2M).

In the structure related to sense amplifier band SAG, a ground line supplying ground voltage GND for use by sense amplifier band SAG is formed at a metal interconnection layer 209 formed of the second layer above metal interconnection layer 202. A power supply line supplying voltage VCC for use by sense amplifier band SAG is formed at a metal interconnection layer 212 formed of the second layer above metal interconnection layer 202. A control line transmitting control signal CTL for use by sense amplifier band SAG and a sense power supply line 211 supplying a predetermined voltage for use by the sense operation of sense amplifier band SAG are formed at a metal interconnection layer 210 formed of the third layer (3M) above the second layer (2M).

In this structure, since memory regions BLK<0> and BLK<1> share data line BDE, metal interconnection layers 207 and 208 formed at the second layer (2M) are used to transmit the data signal of memory region BLK<1>, and are electrically coupled to data line BDE at metal interconnection layer 202 formed of the first layer (1M) via contact holes 214.

Further, the ground line supplying ground voltage GND is formed at a metal interconnection layer 206 formed of the third layer (3M) above metal interconnection layers 207 and 208, and is electrically coupled to metal interconnection layers 204 and 209 formed of the second layer (2M) via contact holes 215 and 216, respectively. Thus, the structure is provided with the ground line at the third layer (3M) above data line BDE extending in the second layer (2M).

The above structure can suppress an influence of coupling noises, which may be exerted on data line BDE extending in the second layer (2M) from metal interconnection layers 205 and 210 transmitting control signals CTL to be used by column decoder 125a and sense amplifier band SAG.

Figure 20:
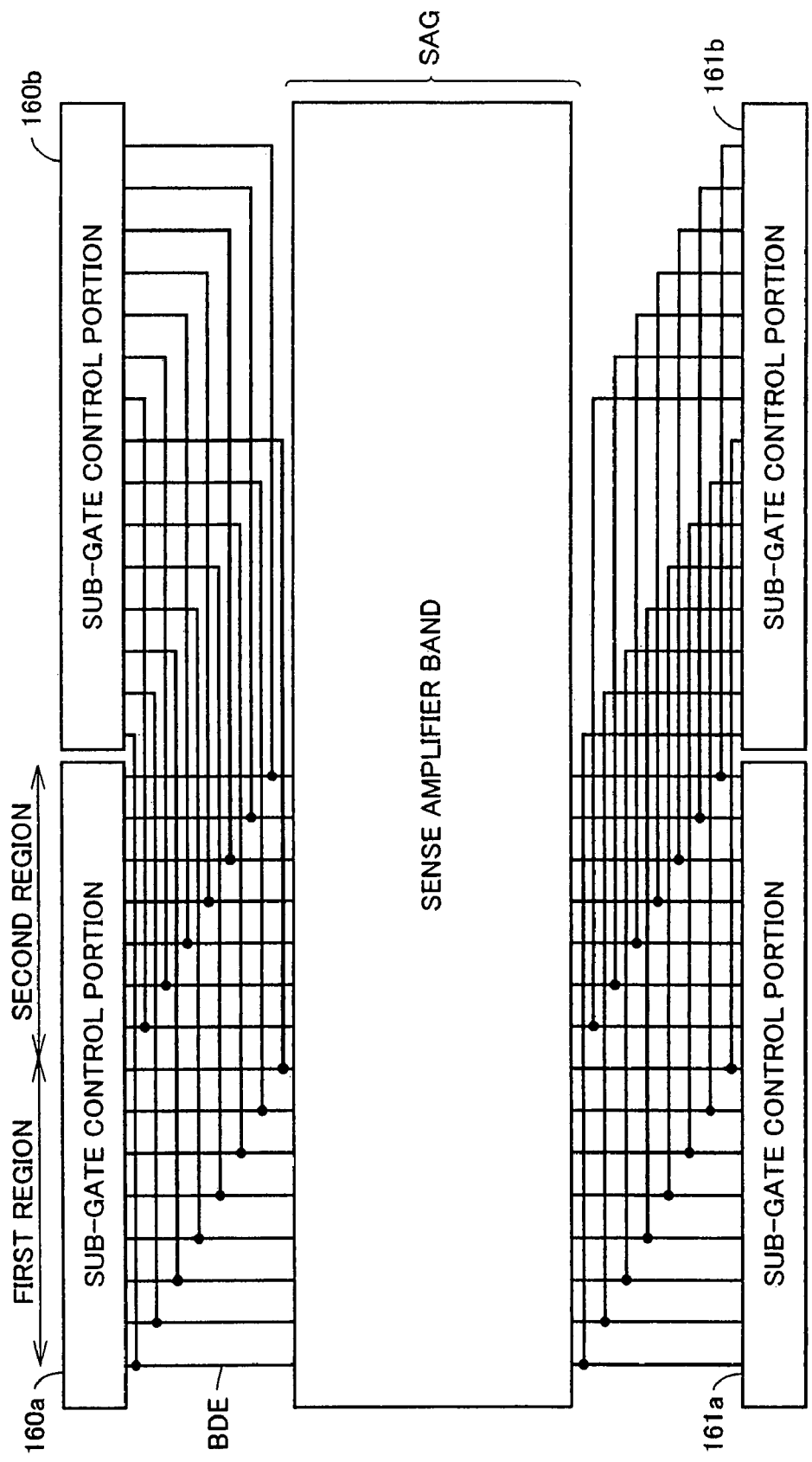
FIG. 20 illustrates a manner of arrangement of connection interconnections employed for sharing the data lines provided corresponding to blocks according to the invention.

In this structure, as shown in FIG. 20, the data lines in memory region BLK<0> are arranged as follows with respect to the data lines in memory region BLK<1>. The data lines included in memory region BLK<0> are crossing to the data lines included in memory region BLK<1>. A first group of the data lines, which are included in memory region BLK<1> and are electrically coupled to the data lines included in memory region BLK<0>, located in the first region are arranged alternately to the second group of data lines, which are included in memory region BLK<1> and are electrically coupled to the data lines included in memory region BLK<0>, located in the second region. This structure can reduce line capacitances between connection lines or interconnections, and thus can further reduce coupling noises.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising:
   a decoder selectively selecting at least one word line out of a plurality of word lines, based on an address input from an outside;
   a plurality of drivers provided to correspond to said plurality of word lines, respectively, and each driving the corresponding word line, wherein
   each of said drivers includes first and second transistors electrically coupling said corresponding word line to a first power supply voltage and a second power supply voltage lower than said first power supply voltage in a complementary manner, respectively, in response to a signal from said decoder,
   said decoder outputs a first logic level signal to the driver corresponding to the selected word line to turn on said first transistor in a normal operation,
   said first transistor is connected to a third power supply voltage lower than said first power supply voltage and higher than said second power supply voltage, instead of said first power supply voltage, in a verify operation,
   said decoder outputs said first logic level signal to the driver corresponding to the selected word line to turn on said first transistor in said verify operation, and
   a voltage level of said first logic level signal is set such that the voltage level of said first logic level signal differs between in said normal operation and in said verify operation and that a drive capability of said first transistor is more increased in said verify operation than in said normal operation.

2. The nonvolatile memory device according to claim 1, wherein
   said decoder outputs a second logic level signal of a logic level opposite to a logic level of said first logic level signal, to each of said drivers to turn on each of said second transistors during standby,
   during said standby, each of said first transistors in each of said drivers is electrically connected to a fourth power supply voltage lower than said first power supply voltage and higher than said second power supply voltage, instead of said first power supply voltage.

3. The nonvolatile memory device according to claim 2, wherein
   said decoder outputs said second logic level signal to the driver corresponding to an unselected word line to turn on each of said second transistors in said normal operation, and
   a voltage level of said second logic level signal is set to be the same voltage level as the voltage level of said first power supply voltage.

4. The nonvolatile memory device according to claim 1, wherein
   said first and second transistors correspond to first conductivity-type and second conductivity-type transistors, respectively,
   said first conductivity-type transistor is formed in a second well of a second conductivity type layered on a first well of the second conductivity type, and
   said second conductivity-type transistor is formed in a well of a first conductivity type provided in said second well of the second conductivity type.

* * * * *